(12) United States Patent
Kim

(10) Patent No.: US 11,690,233 B2
(45) Date of Patent: Jun. 27, 2023

(54) THREE-DIMENSIONAL MEMORY DEVICE HAVING PARALLEL TRENCH TYPE CAPACITOR

(71) Applicant: SK hynix Inc., Icheon-si (KR)

(72) Inventor: Won Seok Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 108 days.

(21) Appl. No.: 17/222,767

(22) Filed: Apr. 5, 2021

(65) Prior Publication Data

US 2022/0149052 A1 May 12, 2022

(30) Foreign Application Priority Data

Nov. 19, 2020 (KR) .................. 10-2020-0155417

(51) Int. Cl.
*H10B 69/00* (2023.01)
(52) U.S. Cl.
CPC ................................ *H10B 69/00* (2023.02)

(58) Field of Classification Search
CPC ............ H01L 27/115; H01L 27/11556; H01L 27/11575; H01L 27/11582; H01L 27/11548; H01L 27/11526; H01L 27/11573; H01L 28/40; H01L 28/60; H01L 28/90
See application file for complete search history.

(56) References Cited

U.S. PATENT DOCUMENTS 9,929,093 B2 * 3/2018 Lee .................... H01L 27/11556
10,629,675 B1 * 4/2020 Nishikawa .......... H01L 29/7883

FOREIGN PATENT DOCUMENTS

| KR | 10-2014-0024609 A | 3/2014 |
| KR | 10-2017-0057060 A | 5/2017 |
| KR | 10-2017-0057936 A | 5/2017 |

* cited by examiner

*Primary Examiner* — Allison Bernstein

(57) ABSTRACT

A 3D memory device may include a logic device layer on a substrate and a memory device layer stacked on the logic device layer. The logic device layer may include logic devices disposed on the substrate. The memory device layer may include a word line stack disposed in an extension area, staircase patterns disposed in the word line stack, a dielectric layer stack in a peripheral area, and capacitors inlayed in the dielectric layer stack.

19 Claims, 19 Drawing Sheets

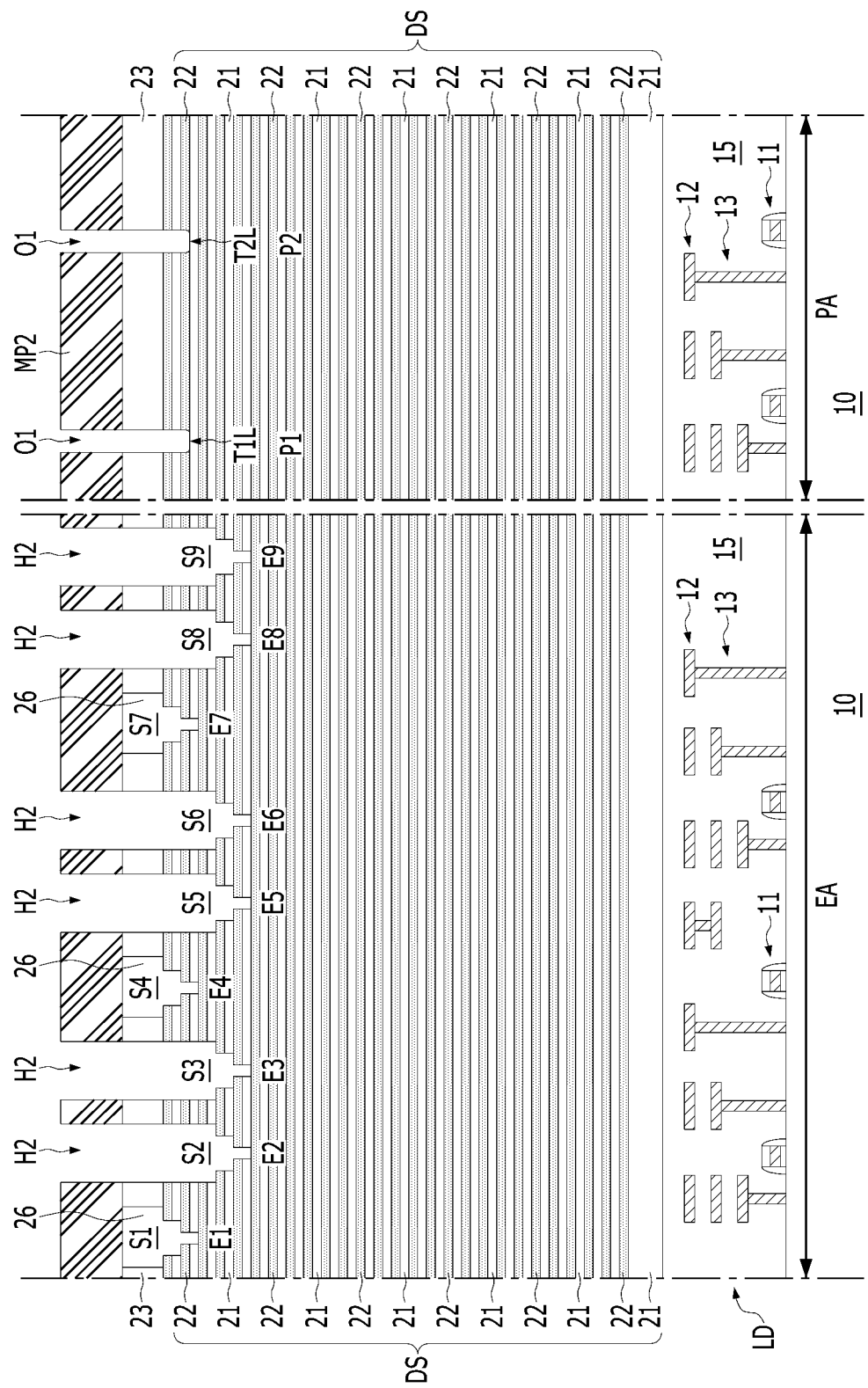

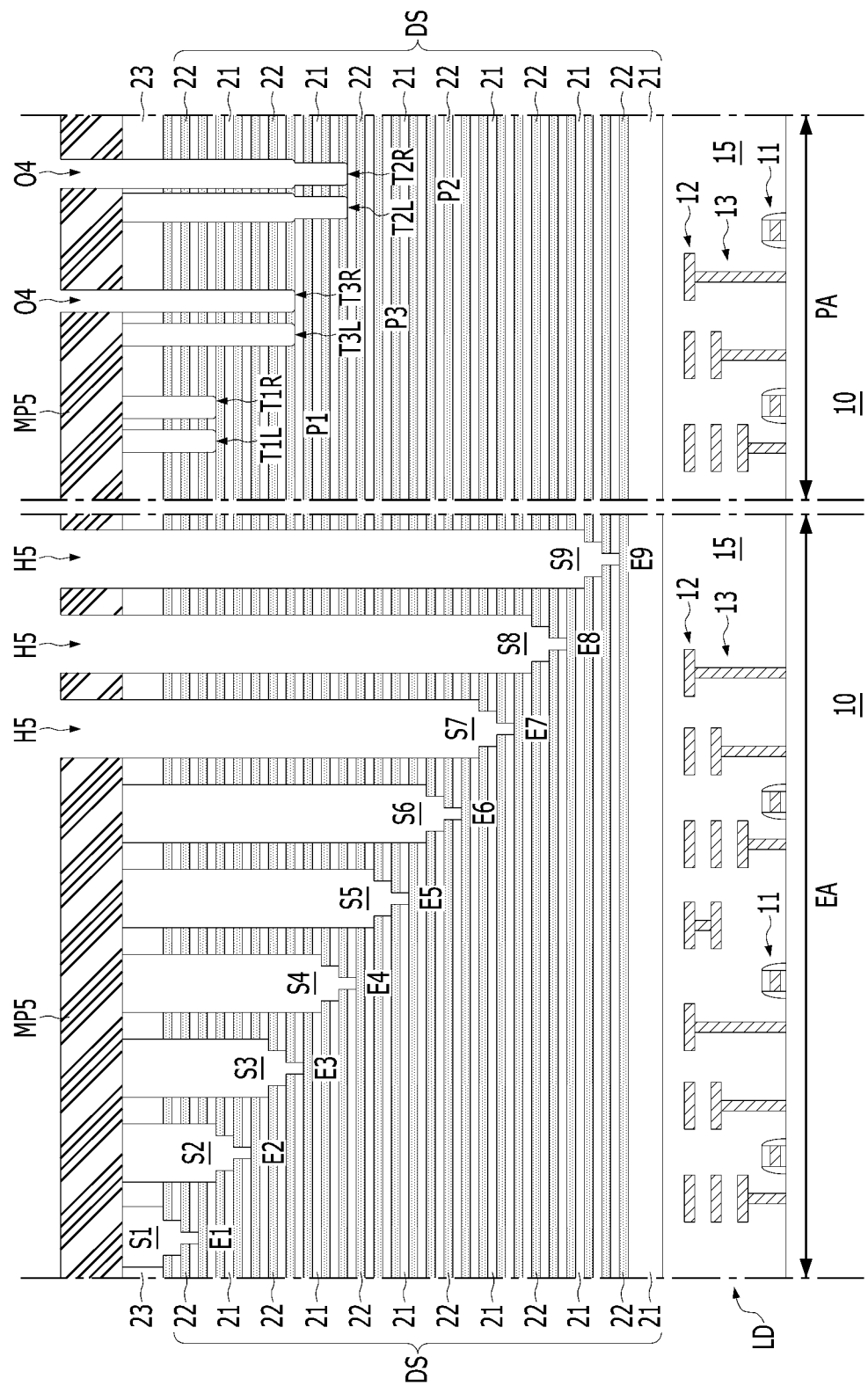

THREE-DIMENSIONAL MEMORY DEVICE HAVING PARALLEL TRENCH TYPE CAPACITOR

CROSS-REFERENCE TO RELATED APPLICATION

This application claims priority under 35 U.S.C. § 119(a) to Korean Patent Application No. 10-2020-0155417 filed on Nov. 19, 2020, which is incorporated herein by reference in its entirety.

BACKGROUND

1. Technical Field

The present disclosure relates to a three-dimensional memory device and a method of manufacturing a three-dimensional memory device. More particularly, the present disclosure relates to a three-dimensional memory device having parallel trench type capacitors and methods of manufacturing a three-dimensional memory device having parallel trench type capacitors.

2. Related Art

Increasing the degree of integration of memory devices requires complex circuits, active devices, and passive devices. As the degree of integration of memory devices increases, a three-dimensional (3D) memory device has been suggested to meet these needs. As a solution, the 3D memory device is attracts attention now and in the future because of the large number of cells per unit area.

SUMMARY

An embodiment of the present disclosure provides a three-dimensional (3D) memory device having parallel trench type capacitors having a shape of parallel walls.

An embodiment of the present disclosure provides a method of manufacturing a 3D memory device having parallel trench type capacitors having a shape of parallel walls.

An embodiment of the present disclosure provides a 3D memory device including capacitors formed using a staircase forming process.

An embodiment of the present disclosure provides a method of forming capacitors using a staircase forming process.

A three-dimensional memory device according to an embodiment of the disclosure may include a logic device layer on a substrate and a memory device layer stacked on the logic device layer. The logic device layer may include logic devices disposed on the substrate. The memory device layer may include a word line stack disposed in an extension area, staircase patterns disposed in the word line stack, a dielectric layer stack in a peripheral area, and capacitors inlayed in the dielectric layer stack.

A three-dimensional memory device according to an embodiment of the disclosure may include a substrate having an extension area and a peripheral area, a word line stack disposed in the extension area, the word line stack including first insulating layers and word lines alternately stacked, a plurality of staircase patterns disposed in the word line stack, an dielectric layer stack disposed in the peripheral area, the dielectric layer stack including the first insulating layers and second insulating layers alternately stacked, and capacitor electrodes disposed in the dielectric layer stack in parallel with each other.

A three-dimensional memory device according to an embodiment of the disclosure may include a logic device layer on a substrate and a memory device layer stacked on the logic device layer. The logic device layer may include logic devices disposed on the substrate. The memory device layer may include a word line stack disposed in an extension area, a plurality of staircase patterns disposed in the word line stack, a dielectric layer stack disposed in a peripheral area, and a plurality of capacitors disposed in the dielectric layer stack. The word line stack includes first insulating layers and word lines alternately stacked. The dielectric layer stack includes the first insulating layers and second insulating layers alternately stacked. The plurality of capacitors include first capacitor electrodes having a first height, second capacitor electrodes having a second height, and third capacitor electrodes having a third height.

A method of manufacturing a three-dimensional memory device according to an embodiment of the disclosure may include forming a logic device layer on a substrate having an extension area and a peripheral area, forming an dielectric layer stack, the dielectric layer stack having first insulating layers and second insulating layers alternately stacked, performing a first patterning process to form firstly recessed staircase patterns recessed from an upper surface of the dielectric layer stack in the extension area, performing a second patterning process to recess some of the staircase patterns to form secondly recessed staircase patterns in the extension area and to form first trenches having a first depth in the dielectric layer stack in the peripheral area, performing a third patterning process to recess some of the staircase patterns to form thirdly recessed staircase patterns in the extension area and to form second trenches having a second depth in the dielectric layer stack in the peripheral area, and performing an electrode forming process to fill the first trenches and the second trenches with a conductive material to form first capacitor electrodes and second capacitor electrodes.

A method of forming a three-dimensional memory device according to an embodiment of the disclosure may include forming a logic device layer on a substrate having an extension area and a peripheral area, forming a dielectric layer stack on the logic device layer, the dielectric layer stack having first insulating layers and second insulating layers alternately stacked, forming a plurality of staircase patterns in the dielectric layer stack in the extension area, forming a plurality of trenches in the dielectric layer stack in the peripheral area, forming a plurality of capacitor electrodes in the plurality of trenches in the peripheral area, replacing the second insulating layer of the dielectric layer stack with word lines in the extension area, with upper surfaces of end portions of the word lines being exposed by the staircase patterns, forming a plurality of word line contacts connected to the exposed upper surfaces of the end portions of the word lines in the extension area, and forming a plurality of capacitor contacts connected to the plurality of capacitor electrodes, respectively, in the peripheral area.

A method of manufacturing a three-dimensional memory device according to an embodiment of the disclosure may include forming a logic device layer on a substrate having an extension area and a peripheral area, forming a dielectric layer stack on the logic device layer, the dielectric layer stack including first insulating layers and second insulating layers alternately stacked, forming staircase patterns having various depths in the dielectric layer stack in the extension area, forming first capacitor electrodes having a first height and second capacitor electrodes having a second height in the dielectric layer stack in the peripheral area, replacing the second insulating layer of the dielectric layer stack with word lines to form a word line stack having the first insulating layers and the word lines alternately stacked in the extension area, forming capacitor contacts connected to the capacitor electrodes in the peripheral area, respectively, and forming capacitor interconnections connected to the capacitor contacts in the peripheral area, respectively.

DETAILED DESCRIPTION

Figure 1A:
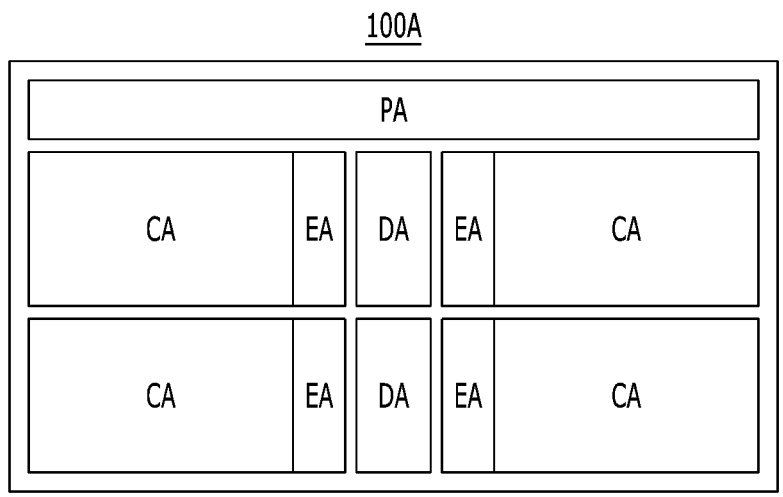
FIGS. 1A and 1B are block layouts of 3D memory devices according to embodiments of the present disclosure.

Various examples and embodiments of the disclosed technology are described below in detail with reference to the accompanying drawings. The drawings might not be necessarily to scale, and in some instances, proportions of at least some structures in the drawings may be exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and different relative positioning relationships or sequences of arranging the layers may be possible. In addition, a described or illustrated example of a multilayer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, however, a multi-layer structure where one or more other intermediate layers exist between the first layer and the second layer or the substrate may be included in other embodiments or examples.

Figure 1B:
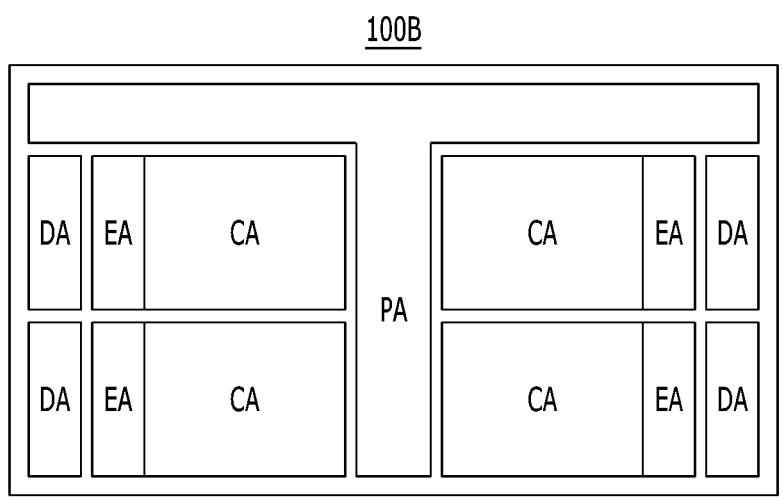

FIGS. 1A and 1B are block layouts of 3D memory devices according to embodiments of the present disclosure. In FIGS. 1A and 1B, 3D memory devices 100A and 100B may each include cell areas CA, extension areas EA, decoder areas DA, and a peripheral area PA. Referring to FIG. 1A, the 3D memory device 100A may include the cell areas CA and the extension areas EA arranged in a matrix form (e.g., in columns and rows), with the decoder areas DA between the extension areas EA. The peripheral areas PA may be disposed adjacent to a row formed by one sides of the cell areas CA, the extension areas EA, and the decoder areas DA, for example. Referring to FIG. 1B, the 3D memory device 100B may include the cell areas CA and the extension areas EA arranged in a matrix form, and the decoder areas DA adjacent to the extension areas EA, respectively. The peripheral area PA may be adjacent to one sides of the cell areas CA, the extension areas EA, and the decoder areas DA, and may also be disposed between adjacent cell areas CA, for example. Each of the extension areas EA may be included in the cell areas CA. For example, each of the extension areas EA may be a part of the cell areas CA.

The cell areas CA may include memory cells arranged in a three-dimensional structure. For example, the cell areas CA may include a word line stack having multi-layered word lines, vertical channels vertically penetrating the word line stack, and bit lines disposed on the word line stack and connected to the vertical channels. Memory layers may be disposed between the word lines and vertical channels of the word line stack. The extension areas EA may have a staircase structure in which the word lines are extended. The word lines in the staircase structure may be connected to word line contact plugs to be electrically connected respectively to the decoder areas DA. The decoder areas DA may provide data received from the peripheral area PA or a logic area (not shown) to the memory cells in the cell areas CA, and may provide data received from the cell areas CA to the peripheral area PA or the logic area. The peripheral area may include a plurality of metal lines, a plurality of metal via plugs, and a plurality of capacitors. The peripheral area PA may include a ROM area. The peripheral area PA and the logic area may provide various voltages and electrical signals to the cell areas CA and the decoder areas DA.

Figure 2A:
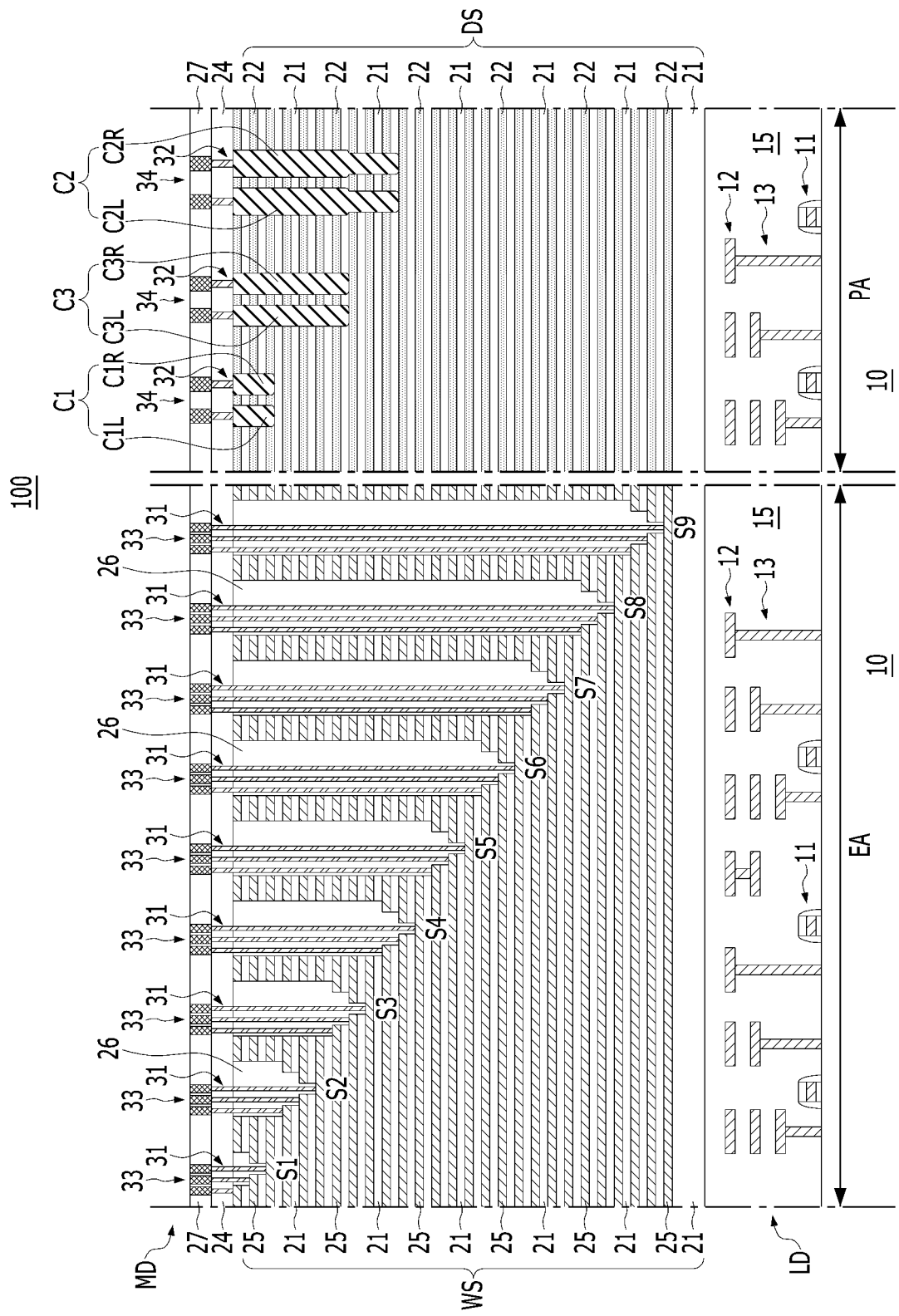
FIGS. 2A and 2B are a longitudinal sectional view and an enlarged perspective view of a portion of a 3D memory device according to an embodiment of the present disclosure.
Figure 2B:
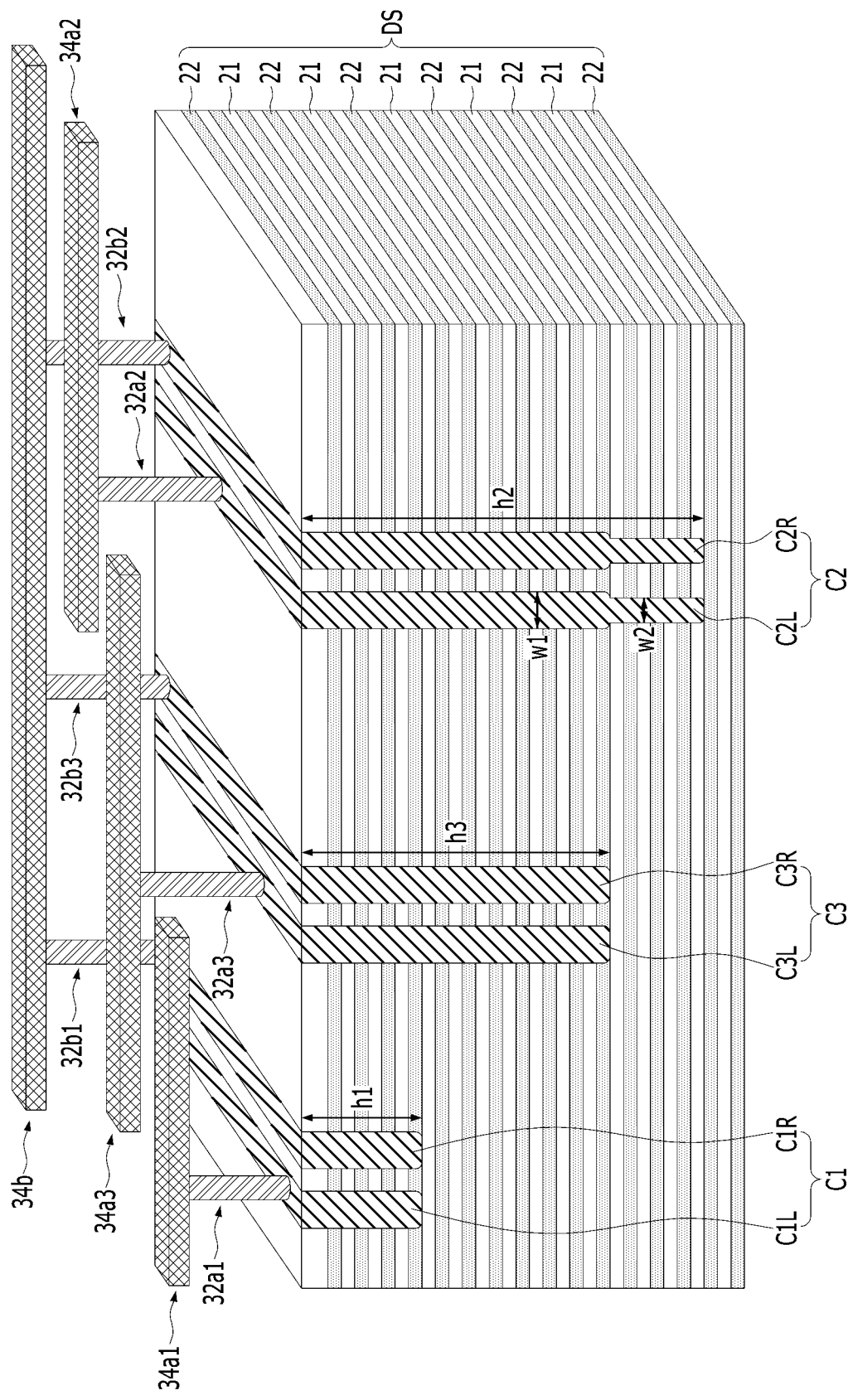

FIGS. 2A and 2B are a longitudinal sectional view and an enlarged perspective view of a portion of a 3D memory device according to an embodiment of the present disclosure. For example, FIG. 2A is a longitudinal sectional view of an extension area EA and a peripheral area PA of FIGS. 1A and 1B, and FIG. 2B is an enlarged perspective view of a portion of the peripheral area PA.

Referring to FIGS. 2A and 2B, a 3D memory device 100 may include a logic device layer LD and a memory device layer MD stacked on the logic device layer LD.

The logic device layer LD may include a substrate 10 with the extension area EA and the peripheral area PA, and logic devices 11 to 13 and a logic insulating layer 15, which are disposed on the substrate 10. The logic devices 11 to 13 may include transistors 11, logic interconnections 12, and logic via plugs 13. The transistors 11 may include a MOSFET. The logic interconnections 12 may include multi-layered metal interconnections extending in a horizontal direction that is perpendicular to the vertical direction. The logic via plugs 13 may vertically electrically connect the substrate 10 to the logic interconnections 12, or the transistor 11 to the logic interconnection 12. For example, a logic via plug 13 may vertically extend from a logic interconnection 12 to be connected to a source/drain region in the substrate 10 or a gate electrode of a transistor 11. The logic insulating layer 15 may be formed on a surface of the substrate 10 to cover the transistors 11, the logic interconnections 12, and the logic via plugs 13. The logic insulating layer 15 may include silicon oxide.

The memory device layer MD may include a word line stack WS, staircase patterns S1 to S9, word line contacts 31, and word line interconnections 33 in the extension area EA, and a dielectric layer stack DS, capacitors C1 to C3, capacitor contacts 32, and capacitor interconnections 34 in the peripheral area PA. The memory device layer MD may further include a gap-fill insulating layer 26 on the staircase patterns S1 to S9 and a planarization layer 24 covering the word line stack WS and the dielectric layer stack DS.

The word line stack WS may include first insulating layers 21 and word lines 25 that are alternately stacked. The first insulating layers 21 may include silicon oxide, and the word lines 31 may include a conductor such as tungsten (W).

Figure 4:
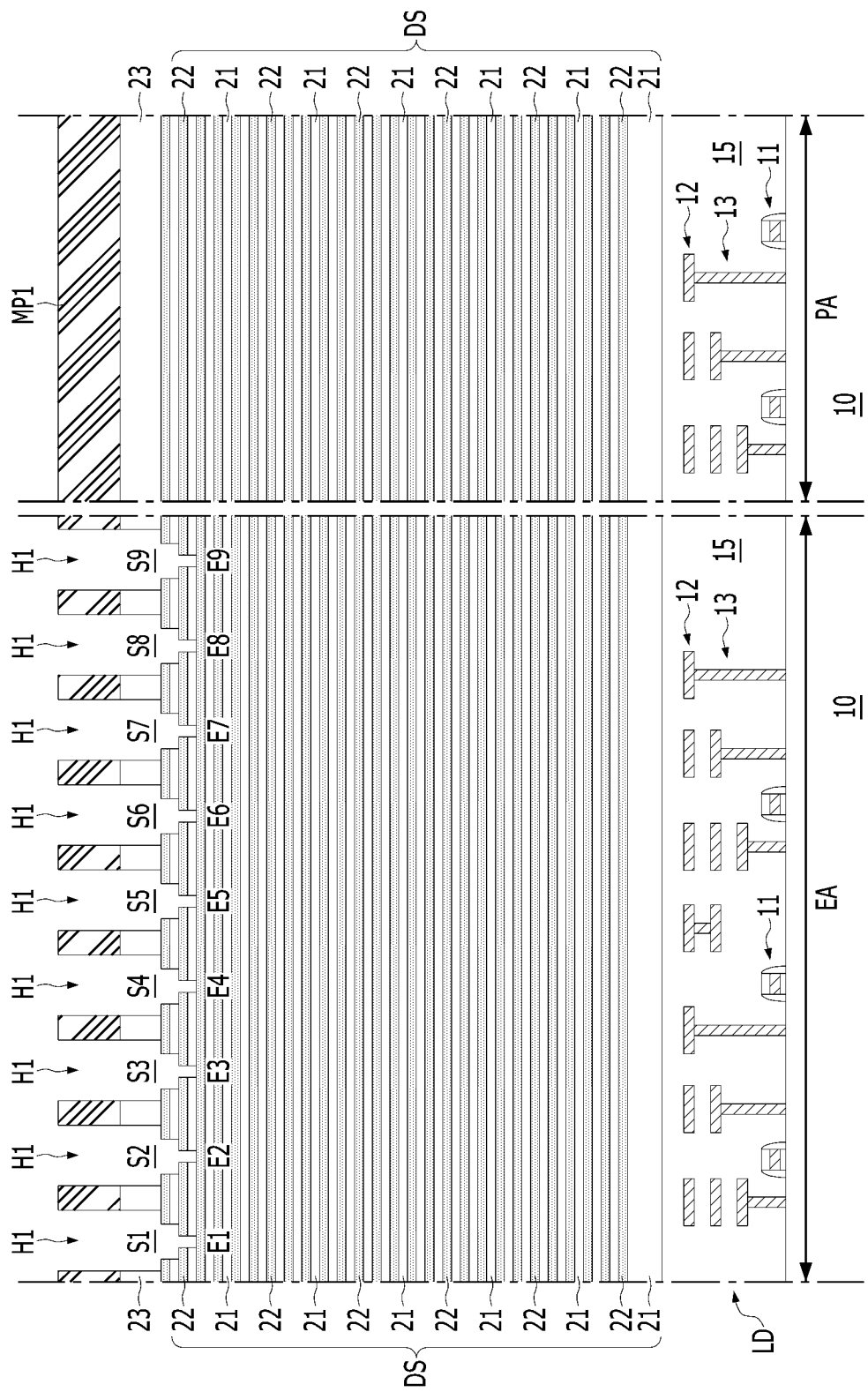

The staircase patterns S1 to S9 may be formed in the word line stack WS. For example, the staircase patterns S1 to S9 may be formed by partially recessing the word line stack WS at corresponding positions E1 to E9 (as illustrated in FIG. 4), respectively. The staircase patterns S1 to S9 may have various depths or heights. In the FIG. 2A, a plurality of staircase patterns S1 to S9, with bottom surfaces located at different vertical levels, are illustrated. Lower portions of the staircase patterns S1 to S9 may have a symmetric staircase shape. That is, each of the staircase patterns S1 to S9 may have a left staircase shape and a right staircase shape having a symmetric shape. The gap-fill insulating layer 26 may fill upper portions of the staircase patterns S1 to S9. The gap-fill insulating layer 26 and the planarization layer 24 may include silicon oxide.

The word line contacts 31 may vertically penetrate the planarization layer 24 and the gap-fill insulating layer 26 to be connected to word lines 25 exposed by the staircase patterns S1 to S9, respectively. The word line contacts 31 may be connected to end portions of the staircase structured word lines 25 in one-half of the symmetric staircase shape of the staircase patterns S1 to S9, respectively. For example, word line contacts 31 may be connected to word lines 25 in the center and left-side end portions of the staircase structured word lines 25 of the symmetric staircase shape. The word line interconnections 33 may extend in a horizontal direction and may be connected to the word line contacts 31 respectively to transmit electrical signals.

The dielectric layer stack DS may include first insulating layers 21 and second insulating layers 22 alternately stacked. The second insulating layers 22 may have an etching selectivity with the first insulating layers 21. For example, the second insulating layers 22 may include silicon nitride. The first insulating layers 21 in the extension area EA and the first insulating layers 21 in the peripheral area PA may be continuous with each other at the same vertical level. That is, the first insulating layers 21 may horizontally extend from the extension area EA to the peripheral area PA or from the peripheral area PA to the extension area EA. Accordingly, the second insulating layers 22 of the dielectric layer stack DS may be disposed at substantially the same level as the word lines 25 of the word line stack WS.

The capacitors C1 to C3 may, for example, include a first capacitor C1, a second capacitor C2, and a third capacitor C3. The capacitors C1 to C3 may be buried or inlayed in the dielectric layer stack DS to partially penetrate the dielectric layer stack DS.

The first to third capacitors C1 to C3 may have different vertical lengths (or heights) to have various capacitances. The first capacitor C1 may include a first left capacitor electrode C1L and a first right capacitor electrode C1R, the second capacitor C2 may include a second left capacitor electrode C2L and a second right capacitor electrode C2R, and the third capacitor C3 may include a third left capacitor electrode C3L and a third right capacitor electrode C3R. The capacitor electrodes C1L, C1R, C2L, C2R, C3L, and C3R may be buried or inlayed in the dielectric layer stack DS. Top surfaces of the capacitor electrodes C1L, C1R, C2L, C2R, C3L, and C3R may be co-planar.

For example, in FIG. 2B, the first left capacitor electrode C1L and the first right capacitor electrode C1R may have a shape of vertical walls in parallel with each other, the second left capacitor electrode C2L and the second right capacitor electrode C2R may have a shape of vertical walls in parallel with each other, and the third left capacitor electrode C3L and the third right capacitor electrode C3R may have a shape of vertical walls in parallel with each other. Wall-shaped capacitor electrodes may extend in a horizontal direction.

The first left capacitor electrode C1L and the first right capacitor electrode C1R of the first capacitor C1 may have a first vertical length or height h1, the second left capacitor electrode C2L and the second right capacitor electrode C2R of the second capacitor C2 may have a second vertical length or height h2, and the third left capacitor electrode C3L and the third right capacitor electrode C3R of the third capacitor C3 may have a third vertical length or height h3. The first height h1, the second height h2, and the third height h3 may be different from one another. Accordingly, the 3D memory device 100 may include a plurality of capacitors C1 to C3 having various heights and various capacitances formed in the peripheral area PA. The left capacitor electrodes and the right capacitor electrodes may have a substantially symmetrical shape or a similar shape to each other within each of the plurality of capacitors C1 to C3.

The capacitor contacts 32 may vertically penetrate the planarization layer 24 to be connected to the capacitor electrodes C1L, C1R, C2L, C2R, C3L, and C3R of the capacitors C1 to C3.

Referring to FIG. 2B, the capacitor contacts 32 may include left capacitor contacts 32a1, 32a2, and 32a3 and right capacitor contacts 32b1, 32b2, and 32b3. The left capacitor contacts 32a1, 32a2, 32a3 may include a first left capacitor contact 32a1 connected to the first left capacitor electrode C1L of the first capacitor C1, a second left capacitor contact 32a2 connected to the second left capacitor electrode C2L of the second capacitor C2, and a third left capacitor contact 32a3 connected to the third left capacitor electrode C3L of the third capacitor C3. The right capacitor contacts 32b1, 32b2, and 32b3 may be connected to the first right capacitor electrode C1R of the first capacitor C1, the second right capacitor electrode C2L of the second capacitor C2, and the third right capacitor electrode C3L of the third capacitor C3, respectively.

The capacitor interconnections 34 may include a first capacitor interconnection 34a1, a second capacitor interconnection 34a2, a third capacitor interconnection 34a3, and a common capacitor interconnection 34b. The first capacitor interconnection 34a1 may be connected to the first left capacitor contact 32a1 of the first capacitor C1. The second capacitor interconnection 34a2 may be connected to the second left capacitor contact 32a2 of the second capacitor C2. The third capacitor interconnection 34a3 may be connected to the third left capacitor contact 32a3 of the third capacitor C3. The common capacitor interconnection 34b may be commonly connected to the first right capacitor contact 32b1, the second right capacitor contact 32b2, and the third right capacitor contact 32b3.

The word line interconnections 33 and the capacitor interconnections 34 may be insulated with a protective layer 27. The protective layer 27 may include silicon oxide or silicon nitride.

In an embodiment, upper and lower portions of the capacitor electrodes C1L, C1R, C2L, C2R, C3L, and C3R may have different horizontal widths. For example, in FIG. 2B, the upper portions of the second left capacitor electrode C2L and the second right capacitor electrode C2R may have a first width w1, and the lower portions of the second left capacitor electrode C2L and the second right capacitor electrode C2R may have a second width w2. The first width w1 may be greater than the second width w2.

The 3D memory device 100 according to an embodiment of the present disclosure may include the capacitor electrodes C1L, C1R, C2L, C2R, C3L and C3R having various vertical lengths (or heights) in the dielectric layer stack DS in the peripheral area PA, and thus the 3D memory device 100 can have parallel trench type capacitors C1 to C3 having various capacitances.

FIGS. 3 to 12 are longitudinal sectional views illustrating a method of forming a 3D memory device according to an embodiment of the present disclosure.

Figure 3:
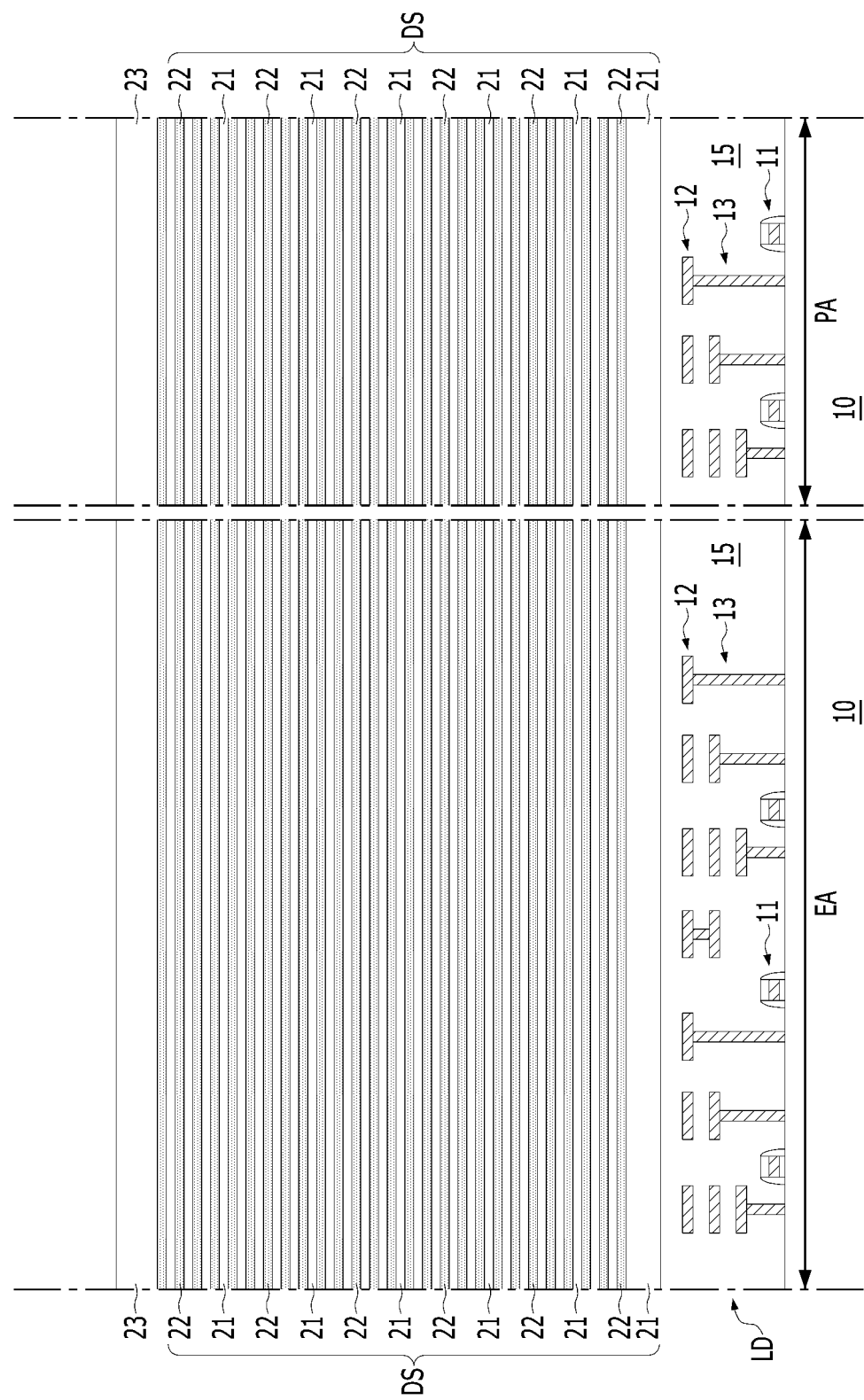
FIGS. 3 to 12 are longitudinal sectional views illustrating a method of forming a 3D memory device according to an embodiment of the present disclosure.

Referring to FIG. 3, a method of forming a 3D memory device according to an embodiment of the present disclosure may include forming a logic device layer LD on a substrate 10 having an extension area EA and a peripheral area PA, and forming a dielectric layer stack DS on the logic device layer LD.

Forming the logic device layer LD may include performing a transistor forming process, an interconnection forming process, a via plug forming process, and an insulator forming process to form transistors 11, logic interconnections 12, via plugs 13, and a logic insulating layer 15 on or over the substrate 10. The forming the logic interconnections 12 may include forming multi-layered metal interconnections to extend in a horizontal direction. The forming the logic via plugs 13 may include forming metal pillars to vertically electrically connect the substrate 10 to the logic interconnections 12, or the transistors 11 to the logic interconnections 12. For example, the logic via plugs 13 may vertically extend from the logic interconnection 12 to be connected to source/drain regions in the substrate 10 or gate electrodes of some of the transistors 11. The forming of the logic insulating layer 15 may include performing a deposition process to form silicon oxide on the substrate 10 to cover the transistors 11, the logic interconnections 12, and the logic via plugs 13.

The forming the dielectric layer stack DS may include performing a plurality of deposition processes to alternately stack first insulating layers 21 and second insulating layers 22. The first insulating layers 21 and the second insulating layers 22 may have an etch selectivity. For example, the first insulating layers 21 may include silicon oxide, and the second insulating layers 22 may include silicon nitride. Accordingly, the first insulating layers 21 may be formed by performing a silicon oxide deposition process, and the second insulating layers 22 may be formed by performing a silicon nitride deposition process. A capping layer 23 may be further formed on the dielectric layer stack DS. The capping layer 23 may include silicon oxide and may be formed by performing the oxide deposition process or a coating process.

Referring to FIG. 4, the method may include forming a first mask pattern MP1 having first holes H1 on the capping layer 23, and performing a first patterning process using the first mask pattern MP1 as an etching mask to partially remove portions of the dielectric layer stack DS exposed in the first holes H1. The first patterning process may include mask trimming processes and etching processes. Accordingly, a plurality of staircase patterns S1 to S9 may be formed in upper portions of the dielectric layer stack DS exposed in the first holes H1 by the first patterning process in the extension area EA. The first mask pattern MP1 may entirely cover the peripheral area PA. The first holes H1 of the first mask pattern MP1 may expose a plurality of positions, for example, first to ninth positions E1 to E9 of the dielectric layer stack DS in the extension area EA. The first mask pattern MP1 may include a photoresist or a hard mask. The hard mask may include inorganic materials such as silicon oxide, silicon nitride, and silicon oxy-carbide. The staircase patterns S1 to S9 may correspond to the first to ninth positions E1 to E9. Thereafter, the first mask pattern MP1 may be removed. In FIG. 4, the number of staircases of the staircase patterns S1 to S9 has been simplified, and other embodiments may have a greater or lesser number of staircase patterns.

Figure 5B:
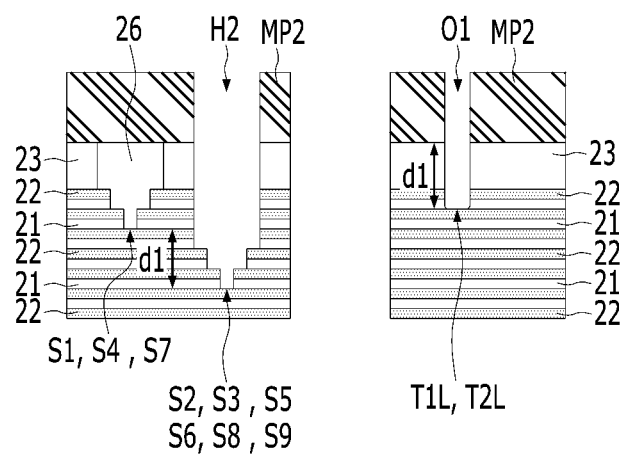

FIG. 5B is an enlarged partial view of FIG. 5A. Referring to FIGS. 5A and 5B, the method may include forming a gap-fill insulating layer 26 on the staircase patterns S1 to S9, forming a second mask pattern MP2 having second holes H2 and first openings O1 on the gap-fill insulating layer 26 and the capping layer 23, and performing a second patterning process using the second mask pattern MP2 as an etching mask to further remove or recess the gap-fill insulating layer 26 and the dielectric layer stack DS exposed in the second holes H2 and the first openings O1. The gap-fill insulating layer 26 may include silicon oxide or an insulating material including carbon such as spin-on-hardmask (SOH). In an embodiment, the gap-fill insulating layer 26 may include a polymeric organic material. The second mask pattern MP2 may include the same material as the first mask pattern MP1. The second holes H2 may be formed in the extension area EA, and the first openings O1 may be formed in the peripheral area PA. The second holes H2 may expose some of the first to ninth positions E1 to E9. For example, in FIG. 5A, the first, fourth, and seventh positions E1, E4, and E7 may be covered with the second mask pattern MP2, and the second, third, fifth, sixth, eighth, and ninth positions E2, E3, E5, E6, E8, and E9 may be exposed by the second holes H2 of the second mask pattern MP2. The gap-fill insulating layer 26 and the dielectric layer stack DS exposed by the second holes H2 and the first openings O1 may be further recessed by a first depth d1. For example, in the extension area EA, the staircase patterns S2, S3, S5, S6, S8, and S9 of the exposed second, third, fifth, sixth, eighth, and ninth positions E2, E3, E5, E6, E8, and E9 may be formed into secondly recessed staircase patterns S2, S3, S5, S6, S8, and S9. The secondly recessed staircase patterns S2, S3, S5, S6, S8, and S9 may be lower than the staircase patterns S1, S4, and S7 of the unexposed positions E1, E4, and E7 by a first depth d1. In the peripheral area PA, the first openings O1 may expose a left portion of the first position P1 and a left portion of the second position P2. The capping layer 23 and the dielectric layer stack DS exposed by the first openings O1 may be partially removed to form a first left trench pattern T1L and a second left trench pattern T2L, each having a first depth d1. Thereafter, the second mask pattern MP2 may be removed. A process of selectively recessing the staircase patterns S2, S3, S5, S6, S8, and S9 and a process of forming the trench patterns T1L and T2L may be performed at the same time.

Figure 6A:
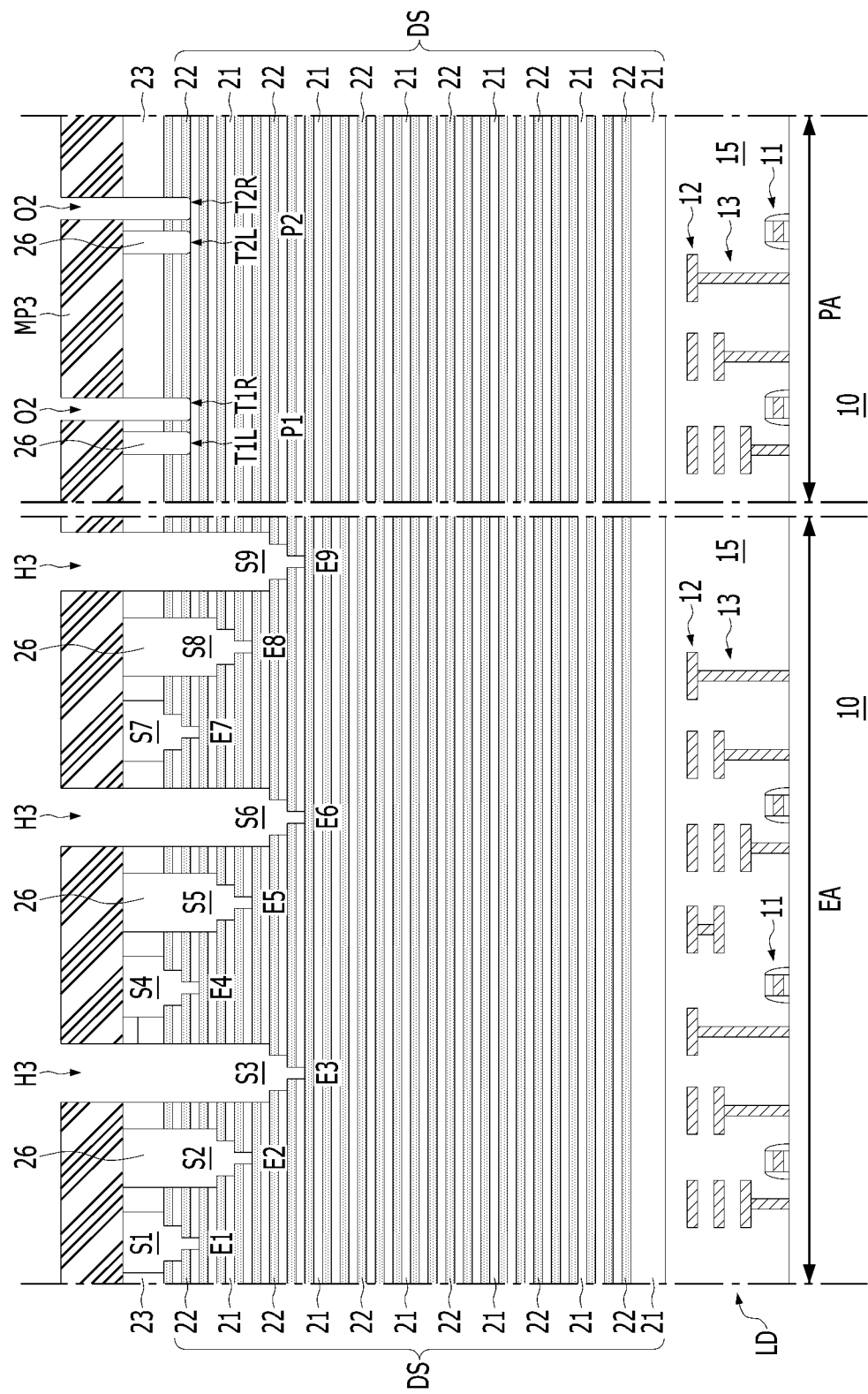
Figure 6B:
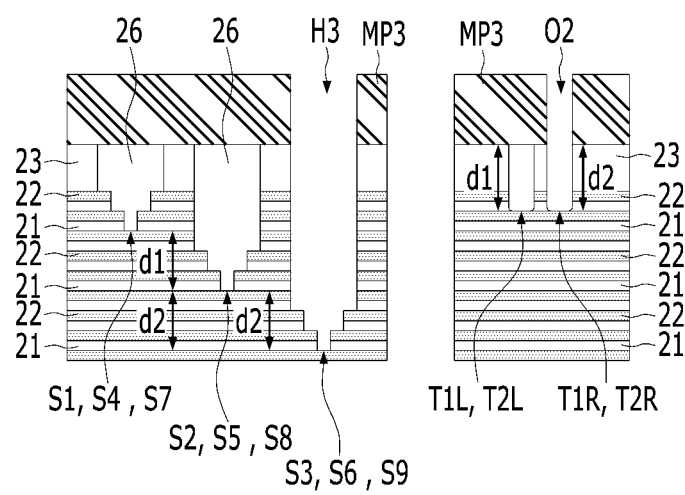

FIG. 6B is an enlarged partial view of FIG. 6A. Referring to FIGS. 6A and 6B, the method may include further forming a gap-fill insulating layer 26 in the staircase patterns S1 to S9 and the trench patterns T1L and T2L, forming a third mask pattern MP3 having third holes H3 and second openings O2 on the gap-fill insulating layer 26 and the capping layer 23, and performing a third patterning process using the third mask pattern MP3 as an etching mask to additionally remove or recess the gap-fill insulating layer 26 and the dielectric layer stack DS exposed in the third holes H3 and the second openings O2. The third mask pattern MP3 may include the same material as the first or second mask patterns MP1 and MP2. The third holes H3 may be formed in the extension area EA, and the second openings O2 may be formed in the peripheral area PA. The third holes H3 may expose some of the first to ninth positions E1 to E9. For example, the first, second, fourth, fifth, seventh, and eighth positions E1, E2, E4, E5, E7, E8 may be covered with the third mask pattern MP3, and the third, sixth, and ninth positions E3, E6, and E9 may be exposed by the third holes H3 of the third mask pattern MP3. The dielectric layer stack DS exposed by the third holes H3 and the second openings O2 may be recessed by a second depth d2. For example, in the extension area EA, the staircase patterns S3, S6, and S9 of the exposed third, sixth, and ninth positions E3, E6, and E9 may be lower than the staircase patterns S2, S5, and S8 of the second, fifth and eighth positions E2, E5, and E8 by the second depth d2. Accordingly, in the extension area EA, the staircase patterns S3, S6, and S9 of the third, sixth, and ninth positions E3, E6, and E9 may be formed into thirdly recessed staircase patterns S3, S6, and S9. The thirdly recessed staircase patterns S3, S6, and S9 may be lower than the staircase patterns S1, S4, S7 of the first, fourth, and seventh positions E1, E4, and E7 by the sum of the first depth d1 and the second depth d2. In an embodiment, the first depth d1 and the second depth d2 may be substantially the same.

In the peripheral area PA, the second openings O2 may expose a right portion of the first position P1 and a right portion of the second position P2. In the peripheral area PA, the capping layer 23 and the dielectric layer stack DS exposed by the second openings O2 may be removed, so that a first right trench pattern T1R and a second right trench pattern T2R each having a second depth d2 can be formed. The first left trench pattern T1L and the first right trench pattern T1R may have a shape adjacent and parallel to each other, and the second left trench pattern T2L and the second right trench pattern T2R may have a shape adjacent and parallel to each other. Thereafter, the third mask pattern MP3 may be removed. In an embodiment in which first depth d1 and the second depth d2 are substantially the same, first right trench pattern T1R and second right trench pattern T2R may be at substantially the same depth at this step.

Figure 7A:
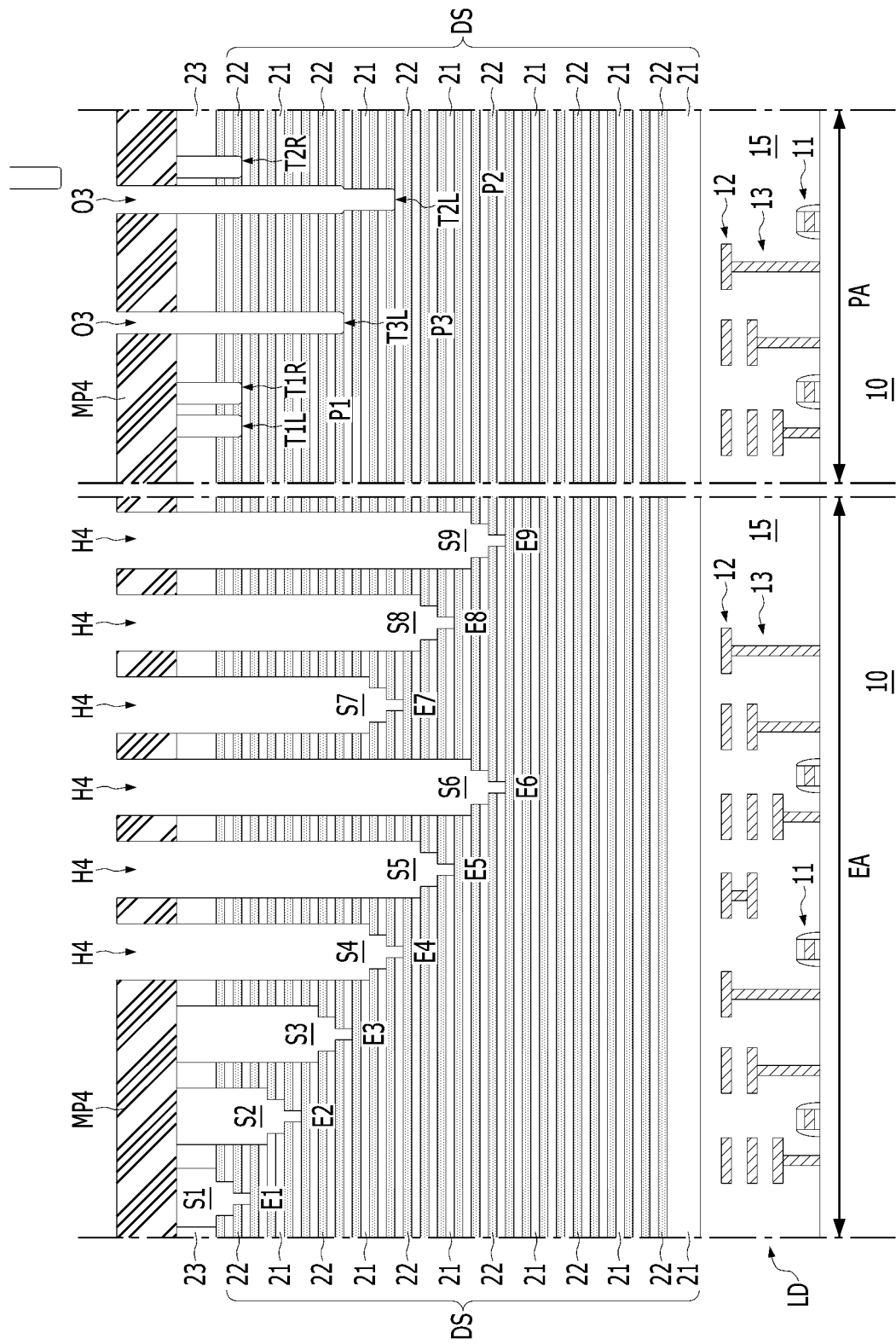
Figure 7B:
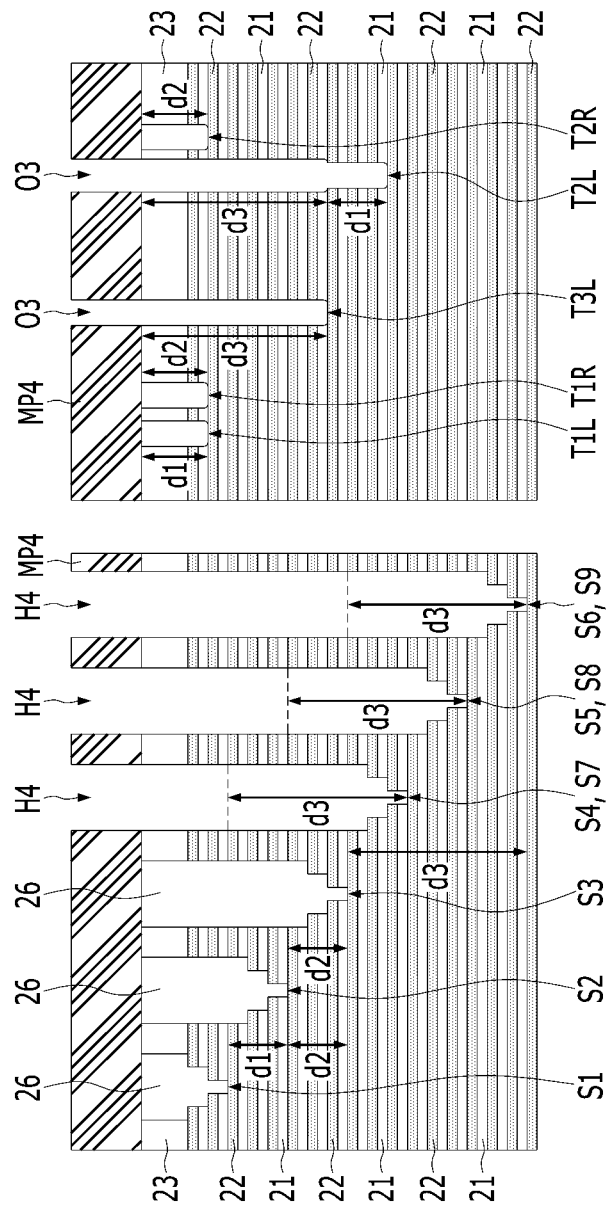

FIG. 7B is an enlarged partial view of FIG. 7A. Referring to FIGS. 7A and 7B, the method may include forming the gap-fill insulating layer 26 in the staircase patterns S1 to S9 and the trench patterns T1L, T1R, T2L, and T2R, forming a fourth mask pattern MP4 having fourth holes H4 and third openings O3 on the gap-fill insulating layer 26 and the capping layer 23, and performing a fourth patterning process using the fourth mask pattern as an etch mask to additionally remove or recess the gap-fill insulating layer 26 and the dielectric layer stack DS exposed in the fourth holes H4 and the third opening O3. The fourth mask pattern MP4 may include the same material as any one of the first to third mask patterns MP1 to MP3. The fourth holes H4 may be formed in the extension area EA, and the third openings O3 may be formed in the peripheral area PA. The fourth holes H4 may expose some of the first to ninth positions E1 to E9. For example, the first to third positions E1 to E3 may be covered with the fourth mask pattern MP4, and the fourth to ninth positions E4 to E9 may be exposed by the fourth holes H4 of the fourth mask pattern MP4. In the extension area EA, the exposed staircase patterns S4 to S9 of the fourth to ninth positions E4 to E9 may be lowered by a third depth d3 by the fourth patterning process. In an embodiment, the third depth d3 may be about three times the first depth d1 or the second depth d2. In the peripheral area PA, the third openings O3 may expose a left portion of the second position P2 and a left portion of the third position P3. The bottom of the second left trench pattern T2L may be lowered by the third depth d3 at the second position P2 in the peripheral area PA, and the third left trench pattern having a third depth d3 may be formed at the third position P3. An inner width of the upper portion of the second left trench pattern T2L may be wider than that of the lower portion of the second left trench pattern T2L at the second position P2 in the peripheral area PA. For example, an upper trench portion having a third depth d3 may have a wider inner width than a lower trench portion having a first depth d1. Thus, the upper trench portion may be formed over two patterning processes, and the lower trench portion may be formed in one patterning process. Thereafter, the fourth mask pattern MP4 may be removed.

Figure 8B:
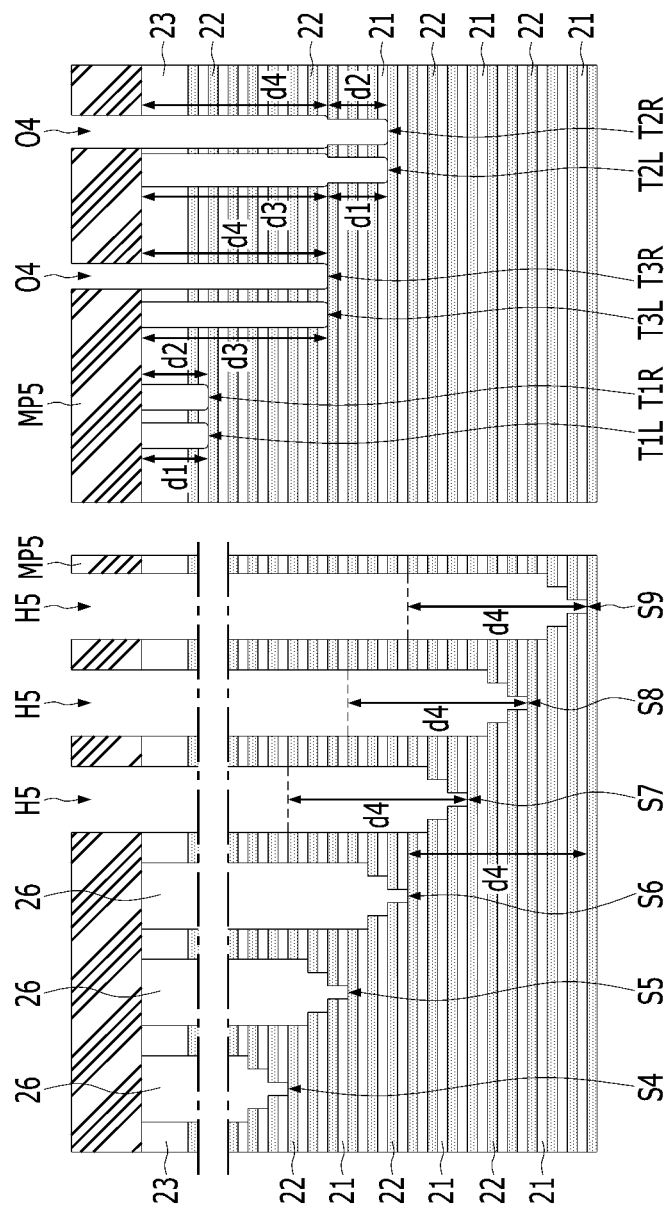

Referring to FIGS. 8A and 8B, the method may include forming the gap-fill insulating layer 26 in the staircase patterns S1 to S9 and the trench patterns T1L, T1R, T2L, T2R, and T3L, forming a fifth mask pattern MP5 having fifth holes H5 and fourth openings O4 on the gap-fill insulating layer 26 and the capping layer 23, and performing a fifth patterning process using the fifth mask pattern MP5 as an etch mask to additionally remove or recess the gap-fill insulating layer 26 and the dielectric layer stack DS exposed in the fifth holes H5 and fourth openings O4. The fifth mask pattern MP5 may include the same material as any one of the first to fourth mask patterns MP1 to MP4. The fifth holes H5 may be formed in the extension area EA, and the fourth openings O4 may be formed in the peripheral area PA. The fifth holes H5 may expose some of the first to ninth positions E1 to E9. For example, the first to sixth positions E1 to E6 may be covered with the fifth mask pattern MP5, and the seventh to ninth positions E7 to E9 may be exposed by the fifth holes H5 of the fifth mask pattern MP5. The staircase patterns S7 to S9 of the positions E7 to E9 exposed by the fifth holes H5 may be formed into fifthly recessed staircase patterns S7 to S9.

In the extension area EA, the staircase patterns S7 to S9 of the exposed seventh to ninth positions E7 to E9 may be lowered by a fourth depth d4 by the fifth patterning process. In an embodiment, the fourth depth d4 may be substantially the same as or similar to the third depth d3. In the peripheral area PA, the fourth openings O4 may expose the right portion of the second position P2 and the right portion of the third position P3. The bottom of the second right trench pattern T2R may be lowered by a fourth depth d4 at the second position P2 in the peripheral area PA, and a third right trench pattern T3R having a fourth depth d4 may be formed at the third position P3. A width of the upper portion of the second right trench pattern T2R may be wider in width than the lower portion of the second right trench pattern T2R at the second position P2 in the peripheral area PA. The first to ninth staircase patterns S1 to S9 and the first to third trench patterns T1L, T1R, T2L, T2R, T3L, and T3R having bottoms located at various vertical levels may be formed by the first to fifth patterning processes. The first left trench pattern T1L and the first right trench pattern T1R may have a similar depth, the second left trench pattern T2L and the second right trench pattern T2R may have a similar depth, and the third left trench pattern T3L and the third right trench pattern T3R may have a similar depth. The first left trench pattern T1L and the first right trench pattern T1R may be adjacent to each other in parallel, the second left trench pattern T2L and the second right trench pattern T2R may be adjacent to each other in parallel, and the third left trench pattern T3L and the third right trench pattern T3R may be adjacent to each other in parallel. Thereafter, the fifth mask pattern MP5 may be removed.

In the present embodiment, the trench pattern pairs T1L-T1R, T1R-T3L, T3L-T3R, T3R-T2L, and T2L-T3L are trench patterns adjacent to each other from among the trench patterns T1L, T1R, T2L, T2R, T3L, and T3R and may be formed by different processes. That is, in the trench forming process, the influence of the loading effect due to the pattern density is reduced, so the pattern to be formed can be accurately formed in the shape of the designed pattern.

Figure 9:
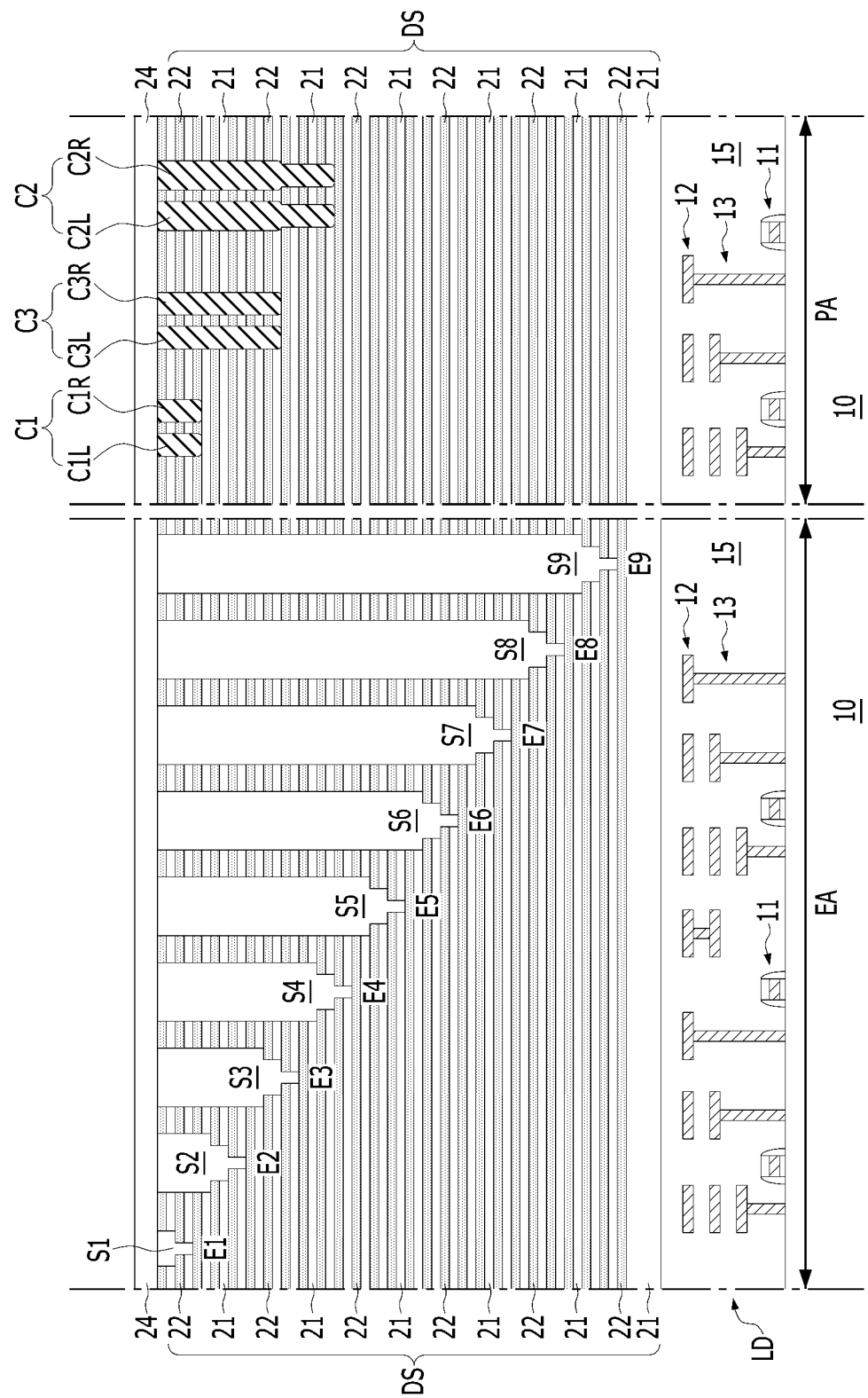

Referring to FIG. 9, the method may include performing an electrode forming process to fill the trench patterns T1L, T1R, T2L, T2R, T3L, and T3R with a conductive material to form capacitor electrodes C1L, C1R, C2L, C2R, C3L, and C3R, and forming a planarization layer 24. The conductive material may include at least one of a doped poly-silicon, a metal such as tungsten, and a metal compound such as titanium nitride. The capacitor electrodes C1L, C1R, C2L, C2R, C3L, and C3R may include first capacitor electrodes C1L and C1R, second capacitor electrodes C2L and C2R, and third capacitor electrodes C3L and C3R. The first capacitor electrodes C1L and C1R may include a first left capacitor electrode C1L and a first right capacitor electrode C1R adjacent to each other in parallel, the second capacitor electrodes C2L and C2R may include a second left capacitor electrode C2L and a second right capacitor electrode C2R adjacent to each other in parallel, and the third capacitor electrodes C3L and C3R may include a third left capacitor electrode C3L and a third right capacitor electrode C3R adjacent to each other in parallel. The capacitor electrodes C1L, C1R, C2L, C2R, C3L, and C3R may be buried or inlaid in the dielectric layer stack DS.

Figure 10:
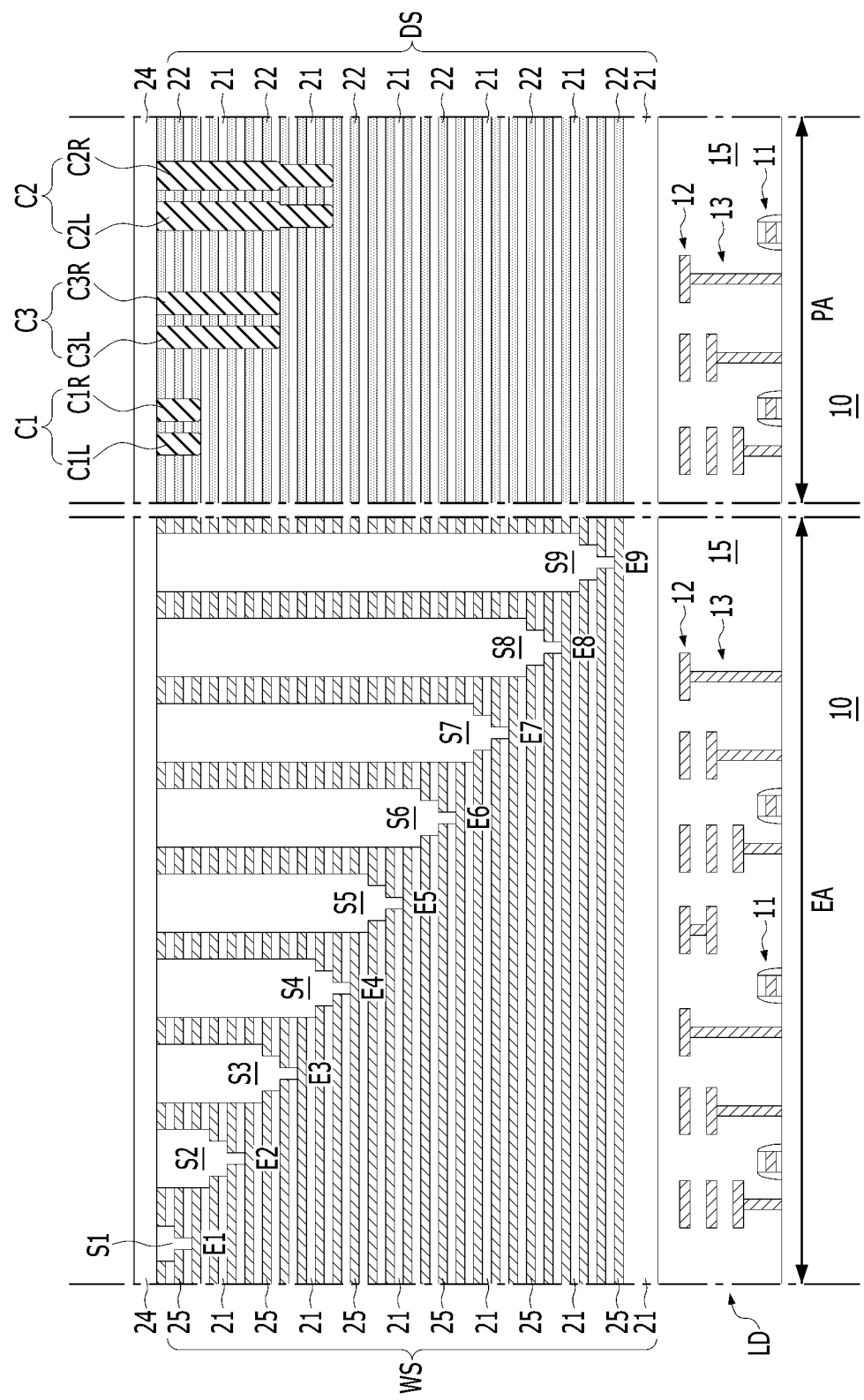

Referring to FIG. 10, the method may include performing a word line replacement process to replace, in the extension area EA, the second insulating layers 22 of the dielectric layer stack DS with word lines 25 to form a word line stack WS. The word lines 25 may include a metal such as tungsten.

Figure 11:
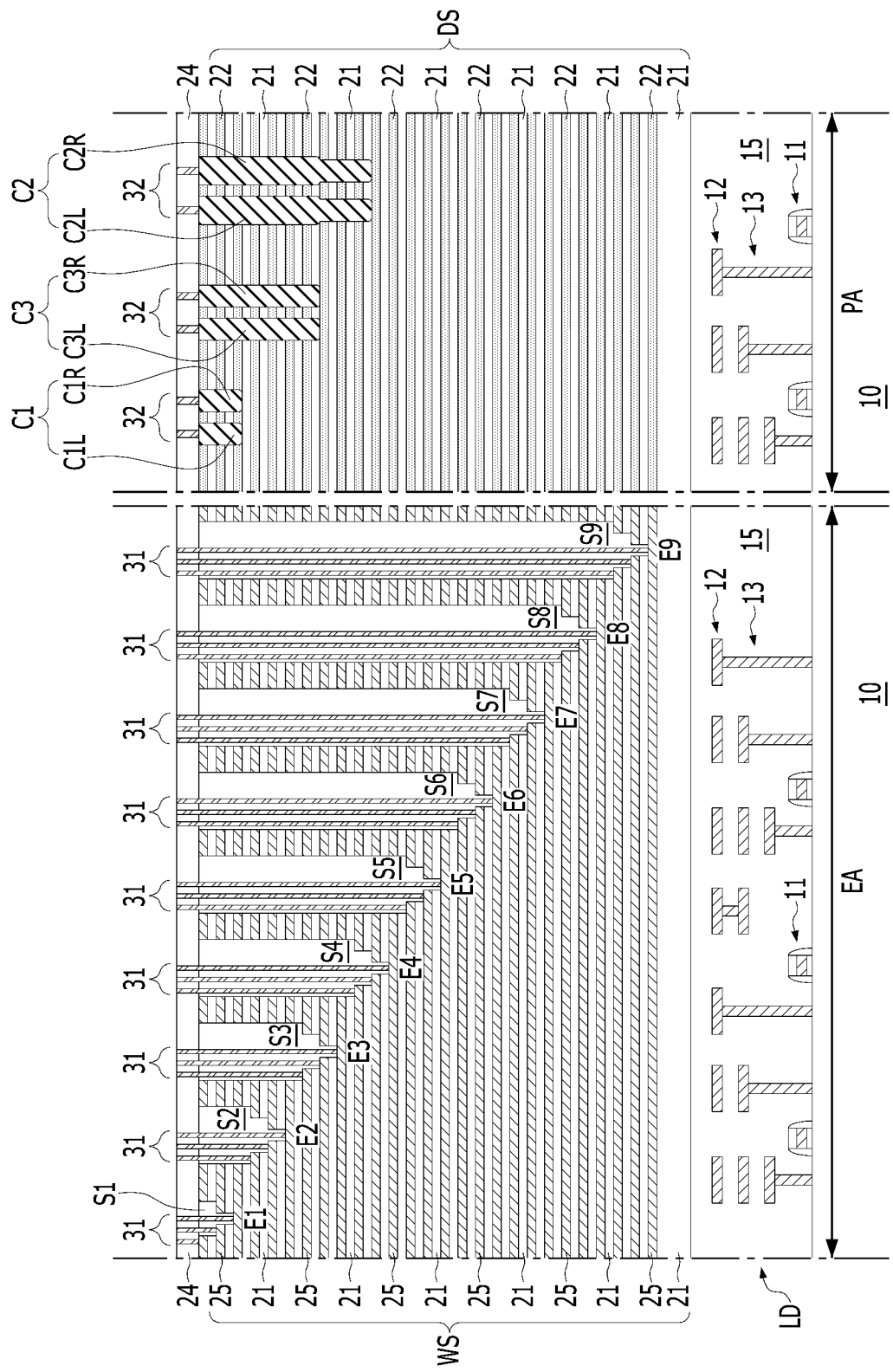

Referring to FIG. 11, the method may include performing a contact forming process to form word line contacts 31 connected to end portions of the exposed word lines 25 of the staircase patterns S1 to S9 in the extension area EA, and to form capacitor contacts 32 connected to the capacitor electrodes C1L, C1R, C2L, C2R, C3L, and C3R in the peripheral area PA. The word line contacts 31 may vertically penetrate the planarization layer 24 and the gap-fill insulating layer 26 to be directly connected to the respective word lines 25. Portions of the staircase patterns S1 to S9 might not be connected to the word line contacts 31. For example, the word lines 25 exposed on the left half portions of the staircase patterns S1 to S9 may be connected to the word line contacts 31 and the word lines 25 exposed on the right half portions of the staircase patterns S1 to S9 might not be connected to the word line contacts 31. In an embodiment, the second insulating layers 22 of the dielectric layer stack DS at the right half portions of the staircase patterns S1 to S9 may remain without being replaced by the word lines 25.

Figure 12:
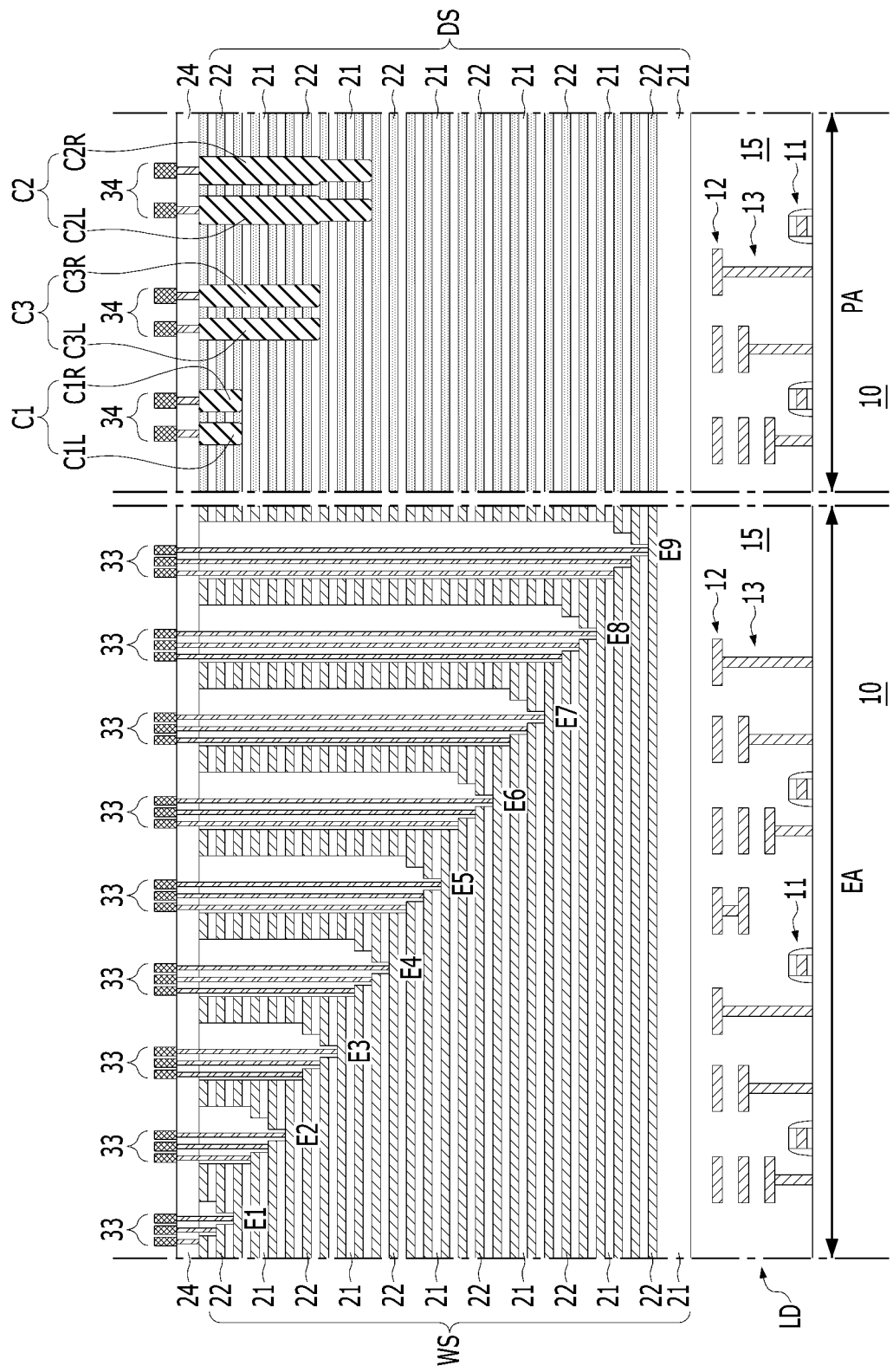

Referring to FIG. 12, the method may include performing an interconnection forming process to form word line interconnections 33 on the word line contacts 31 and capacitor interconnections 34 on the capacitor contacts 32. The word line interconnections 33 and the capacitor interconnections 34 may include a metal such as tungsten.

Since the parallel trench-type capacitors C1 to C3 in the peripheral area PA can be simultaneously formed with the staircase patterns S1 to S9 in the extension area EA, the trench-type capacitors C1 to C3 can be secured without an additional capacitor forming process, and thus a manufacturing process can be simplified, and the manufacturing cost can be reduced.

As mentioned above, the trench forming processes for forming the additional capacitors C1 to C3 can be accurately performed, so that the target capacitance of the capacitors can be sufficiently secured.

Figure 13:
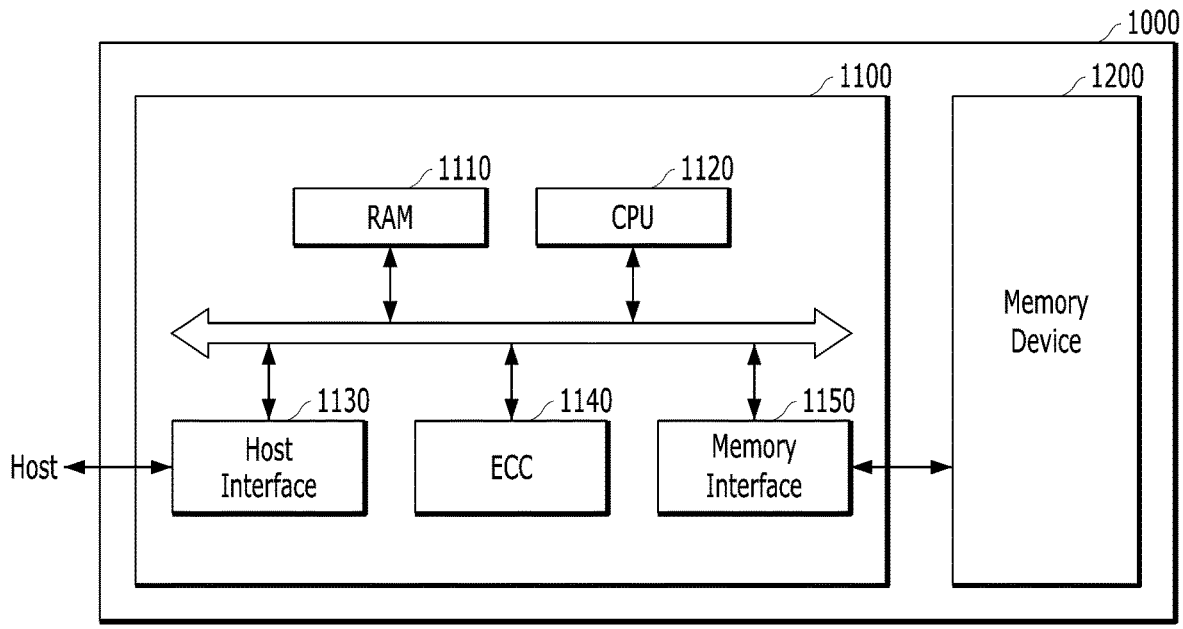
FIGS. 13 and 14 are block diagrams illustrating a configuration of memory systems in accordance with embodiments of the present disclosure.

FIG. 13 is a block diagram illustrating a configuration of a memory system in accordance with an embodiment of the present disclosure. Referring FIG. 13, a memory system 1000 may include a memory device 1200 and a controller 1100. The memory device 1200 may be used to store data information having a variety of data forms such as text, graphics, and software codes. The memory device 1200 may be a nonvolatile memory. Furthermore, the memory device 1200 may include the 3D memory device 100 shown in FIGS. 2A and 2B. The controller 1100 may be coupled to a host Host and the memory device 1200. The controller 1100 may access the memory device 1200 in response to a request from the host Host. For example, the controller 1100 may control read, write, erase, and background operations of the memory device 1200. The controller may include at least one of a random access memory (RAM) 1110, a central processing unit (CPU) 1120, a host interface 1130, an error correction code (ECC) circuit 1140, and a memory interface 1150. The RAM 1110 may be used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like. The CPU 1120 may control overall operations of the controller 1100. For example, the CPU 1120 may operate firmware such as a flash translation layer (FTL) stored in the RAM 1110. The host interface 1130 may interface with the host Host. For example, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol a serial-ATA protocol, a parallel-ATA protocol, a small computer small interface (SCSI) protocol, an enhanced small disk interface (ESDI) protocol, and an integrated drive electronics (IDE) protocol, a private protocol, and the like. The ECC circuit 1140 may use an error correction code (ECC) to detect and correct errors in data read from the memory device 1200. The memory interface 1150 may interface with the memory device 1200. For example, the memory interface 1150 may include a NAND interface or a NOR interface. For example, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host. Since the memory system 1000 according to the present embodiment may include the memory device 1200 having improved integration and characteristics resulting from embodiments of the disclosure, the integration, and characteristics of the memory system 1000 may also be improved.

Figure 14:
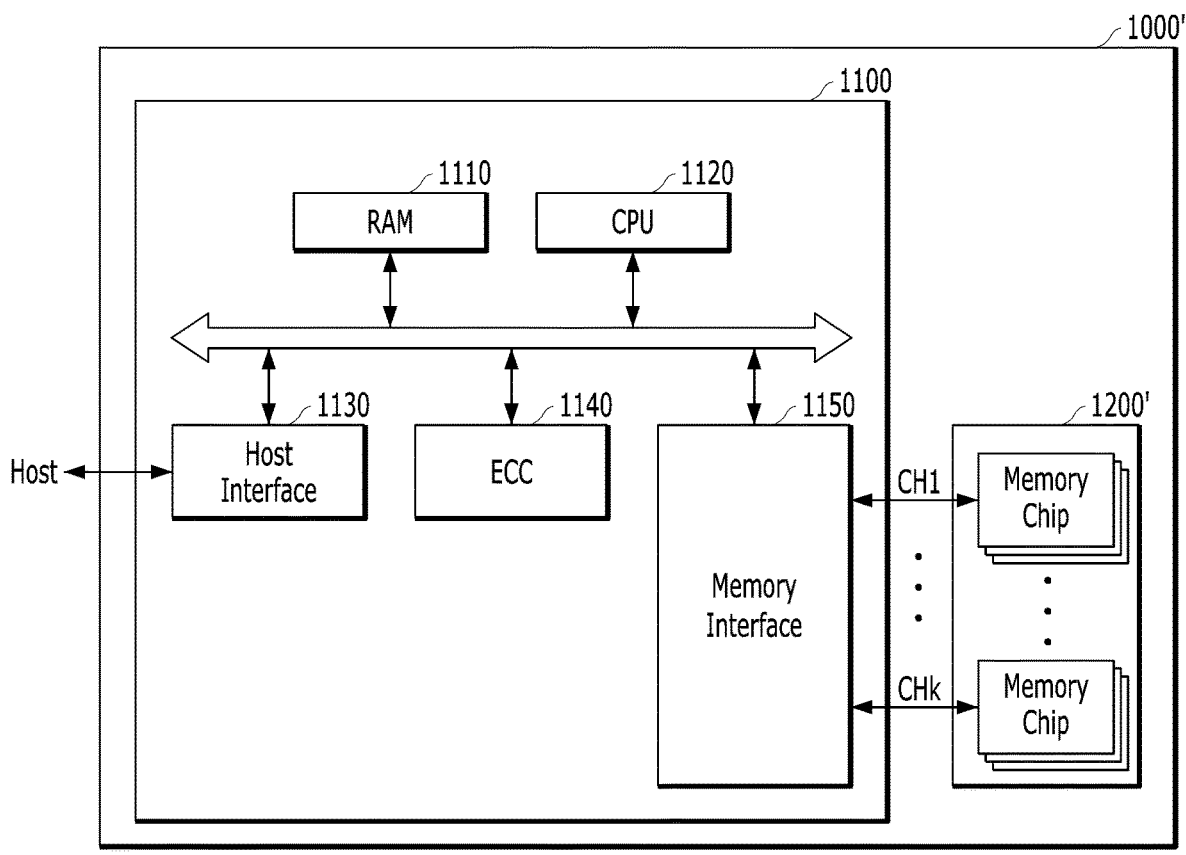

FIG. 14 is a block diagram illustrating a configuration of a memory system according to an embodiment of the present disclosure. Hereinafter, repetitive explanation will be omitted if deemed redundant. Referring to FIG. 14, a memory system 1000' according to an embodiment may include a memory device 1200' and a controller 1100. Furthermore, the controller 1100 may include a RAM 1110, a CPU 1120, a host interface 1130, an ECC circuit 1140, a memory interface 1150 and so on. The memory device 1200' may include a nonvolatile memory. Furthermore, the memory device 1200' may have the 3D memory device 100 shown in FIGS. 2A and 2B. In addition, the memory device 1200' may include a multi-chip package having a plurality of memory chips. The plurality of memory devices are divided into a plurality of groups. The plurality of groups may communicate with the controller 1100 through first to k-th channels CH1 to CHk (where k is an integer). The memory chips of each group communicate with the controller 1100 through a common channel. For reference, the memory system 1000' may be modified such that each single memory chip is coupled to a corresponding single channel. As described above, since the memory system 1000' according to the embodiment may include the memory device 1200' having improved integration and characteristics resulting from embodiments of the disclosure, the integration, and characteristics of the memory system 1000' may also be improved. In particular, the memory device 1200' may include the multi-chip package, whereby the data storage capacity and the operating speed thereof can be enhanced.

Figure 15:
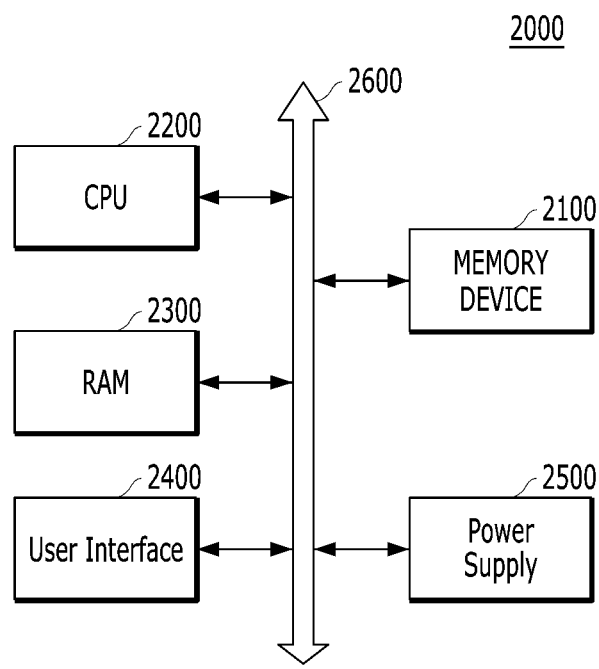
FIGS. 15 and 16 are block diagrams illustrating a configuration of computing systems according to embodiments of the present disclosure.

FIG. 15 is a block diagram illustrating a configuration of a computing system according to an embodiment of the present disclosure. Hereinafter, repetitive explanation will be omitted if deemed redundant. Referring to FIG. 15, a computing system 2000 according to an embodiment of the present disclosure may include a memory device 2100, a CPU 2200, a RAM 2300, a user interface 2400, a power supply 2500, a system bus 2600, and so forth. The memory device 2100 stores data provided via the user interface 2400, data processed by the CPU 2200, etc. Furthermore, the memory device 2100 may be electrically coupled to the CPU 2200, the RAM 2300, the user interface 2400, the power supply 2500, etc. by the system bus 2600. For example, the memory device 2100 may be connected to the system bus 2600 through a controller (not shown) or directly connected to the system bus 2600. In the case where the memory device 2100 is directly coupled to the system bus 2600, the function of the controller may be performed by the CPU 2200, the RAM 2300, etc. The memory device 2100 may include a nonvolatile memory. The memory device 2100 may include the 3D memory device 100 shown in FIGS. 2A and 2B. Furthermore, the memory device 2100 may include the multi-chip package including a plurality of memory chips described in reference to FIG. 14. The computing system 2000 may include one of a computer, an ultra-mobile PC (UMPC), a workstation, a netbook, a personal digital assistance (PDA), a portable computer, a web tablet, a wireless phone, a mobile phone, a smart phone, an e-book, a portable multimedia player (PMP), a portable gaming device, a navigation device, a black box, a digital camera, a 3D television, a digital audio recorder, a digital audio player, a digital picture recorder, a digital picture player, a digital video recorder, a digital video player, a device capable of transmitting and receiving information in a wireless environment, one of various electronic devices composing a home network, a computer network, or a telematics network, or an RFID deice. As described above, since the computing system 2000 according to the embodiment includes the memory device 2100 having improved integration and char-acteristics resulting from embodiments of the disclosure, the characteristics of the computing system 2000 may also be improved.

Figure 16:
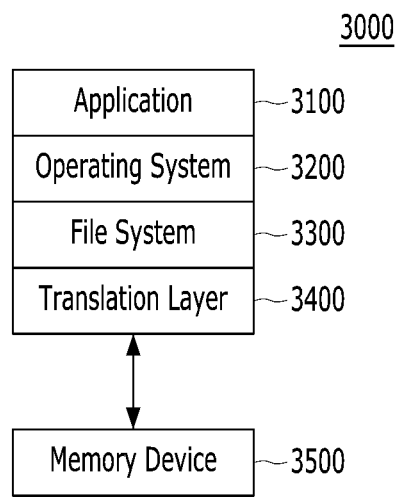

FIG. 16 is a block diagram illustrating a computing system according to an embodiment of the present disclosure. Referring to FIG. 16, a computing system 3000 according to an embodiment of the present disclosure may include a software layer, which has an operating system 3200, an application 3100, a file system 3300, a translation layer 3400, and so forth. Furthermore, the computing system 3000 may include a hardware layer such as a memory device 3500. The operating system 3200 may manage software resources and hardware resources, etc. of the computing system 3000 and may control program execution by the CPU. The application 3100 may be various application programs executed in the computing system 3000 and may be a utility executed by the operating system 3200. The file system 3300 may refer to a logical structure for controlling data, files, etc. which are present in the computing system 3000 and may organize files or data to be stored in the memory device 3500 or the like according to a given rule. The file system 3300 may be determined depending on the operating system 3200 used in the computing system 3000. For example, if the operating system 3200 is Microsoft's Windows system, then the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like. Although the operating system 3200, the application 3100, and the file system 3300 are expressed by separate blocks in the drawing, the application 3100 and the file system 3300 may be included in the operating system 3200. The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like. The memory device 3500 may be a nonvolatile memory. Furthermore, the memory device 3500 may include the 3D memory device 100 shown in FIGS. 2A and 2B. As described above, since the computing system 3000 according to the present embodiment may include the memory device 3500 having improved integration and char-acteristics resulting from embodiments of the disclosure, the characteristics of the computing system 3000 may also be improved.

The 3D memory device according to embodiments of the present disclosure may include the parallel trench type capacitors having a shape of parallel walls in the peripheral area, and thus may include various capacitors having various capacitances.

Since the 3D memory device according to embodiments of the present disclosure may include parallel trench type capacitors having a shape of parallel walls in a peripheral area, the degree of freedom in designing a logic area may be improved.

The 3D memory device according to embodiments of the present disclosure may include parallel trench type capacitors having a shape of parallel walls formed in the peripheral area by using a staircase forming process in an extension area, so the manufacturing process can be simplified and the cost can reduce.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A three-dimensional memory device comprising:
a logic device layer on a substrate; and
a memory device layer stacked on the logic device layer,
wherein the logic device layer includes logic devices disposed on the substrate,
wherein the memory device layer includes:
a word line stack disposed in an extension area;
staircase patterns disposed in the word line stack;
a dielectric layer stack in a peripheral area; and
capacitors inlayed in the dielectric layer,
wherein the capacitors include a first capacitor having a first capacitor electrodes and a second capacitor having a second capacitor electrodes,
wherein:
the first capacitor electrodes have a first height,
the second capacitor electrodes have a second height, and
the first height is less than the second height.

2. The three-dimensional memory device of claim 1, wherein:
the first capacitor electrodes include a first left capacitor electrode and a first right capacitor electrode,
the second capacitor electrodes include a second left capacitor electrode and a second right capacitor electrode,
the first left capacitor electrode and the first right capacitor electrode each have a wall-like shape in parallel with each other, and
the second left capacitor electrode and the second right capacitor electrode each have a wall-like shape in parallel with each other.

3. The three-dimensional memory device of claim 2, wherein:
the capacitors further include a third capacitor having third capacitor electrodes inlayed in the dielectric layer, and
the third capacitor electrodes have a third height that is greater than the first height and less than the second height.

4. The three-dimensional memory device of claim 2, wherein at least one of the second left capacitor electrode and the second right capacitor electrode of the second capacitor includes an upper portion having a first horizontal width and a lower portion having a second horizontal width, and
wherein the first horizontal width is greater than the second horizontal width.

5. The three-dimensional memory device of claim 2, further comprising:
a planarization layer disposed on the dielectric layer; and
capacitor contacts penetrating the planarization layer to be connected to the first and second capacitor electrodes,
wherein the capacitor contacts include:
a first left capacitor contact connected to the first left capacitor electrode;
a first right capacitor contact connected to the first right capacitor electrode;
a second left capacitor contact connected to the second left capacitor electrode; and
a second right capacitor contact connected to the second right capacitor electrode.

6. The three-dimensional memory device of claim 5, further comprising capacitor interconnections disposed on the capacitor contacts,
wherein the capacitor interconnections include:
a first capacitor interconnection connected to the first left capacitor contact,
a second capacitor interconnection connected to the second left capacitor contact; and
a common capacitor interconnection commonly connected to the first right capacitor contact and the second right capacitor contact.

7. The three-dimensional memory device of claim 1, wherein each of the staircase patterns has a symmetrical shape formed by a left staircase shape and a right staircase shape.

8. The three-dimensional memory device of claim 1, wherein the dielectric layer includes first insulating layers and second insulating layers alternately stacked.

9. The three-dimensional memory device of claim 8, wherein the word line stack includes the first insulating layers and word lines alternately stacked.

10. The three-dimensional memory device of claim 9, wherein the second insulating layers and the word lines are positioned at same levels, respectively.

11. The three-dimensional memory device of claim 1, wherein the logic devices include transistors, logic interconnections, and logic via plugs.

12. A three-dimensional memory device comprising:
a substrate having an extension area and a peripheral area;
a word line stack disposed in the extension area, the word line stack including first insulating layers and word lines alternately stacked;
a plurality of staircase patterns disposed in the word line stack;
a dielectric layer stack disposed in the peripheral area; and
capacitor electrodes disposed in the dielectric layer in parallel with each other,
wherein the capacitor electrodes include left capacitor electrodes and right capacitor electrodes that are inlayed in the dielectric layer and that have a wall-like shape.

13. The three-dimensional memory device of claim 12, wherein the dielectric layer including the first insulating layers and second insulating layers alternately stacked.

14. The three-dimensional memory device of claim 13, wherein the left capacitor electrodes include a first left capacitor electrode and a second left capacitor electrode inlayed in the dielectric layer, the first left capacitor electrode having a first height and the second left capacitor electrode having a second height, and wherein the first height is less than the second height.

15. The three-dimensional memory device of claim 14, wherein the right capacitor electrodes include a first right capacitor electrode adjacent and parallel to the first left capacitor electrode and a second right capacitor electrode adjacent and parallel to the second left capacitor electrode.

16. A three-dimensional memory device comprising:
a logic device layer on a substrate; and
a memory device layer stacked on the logic device layer,
wherein the logic device layer includes logic devices disposed on the substrate,
wherein the memory device layer includes:
a word line stack disposed in an extension area;
a plurality of staircase patterns disposed in the word line stack;
a dielectric layer stack disposed in a peripheral area; and
a plurality of capacitors disposed in the dielectric layer,
wherein the word line stack includes first insulating layers and word lines alternately stacked,
wherein the dielectric layer includes the first insulating layers and second insulating layers alternately stacked, and
wherein the plurality of capacitors include first capacitor electrodes having a first height, second capacitor electrodes having a second height, and third capacitor electrodes having a third height.

17. The three-dimensional memory device of claim 16, wherein the first capacitor electrodes include a first left capacitor electrode and a first right capacitor electrode adjacent to each other,
wherein the second capacitor electrodes include a second left capacitor electrode and a second right capacitor electrode adjacent to each other, and
wherein the third capacitor electrodes include a third left capacitor electrode and a third right capacitor electrode adjacent to each other.

18. The three-dimensional memory device of claim 17, wherein the first left capacitor electrode and the first right capacitor electrode are inlayed in the dielectric layer to have a wall-like shape in parallel with each other,
wherein the second left capacitor electrode and the second right capacitor electrode are inlayed in the dielectric layer to have a wall-like shape in parallel with each other, and
wherein the third left capacitor electrode and the third right capacitor electrode are inlayed in the dielectric layer to have a wall-like shape in parallel with each other.

19. The three-dimensional memory device of claim 16, wherein the third height is greater than the first height and less than the second height.

\* \* \* \* \*